(12) United States Patent
Chen et al.

(10) Patent No.: US 12,293,034 B2
(45) Date of Patent: May 6, 2025

(54) DISPLAY DEVICE WITH SOURCE DRIVER HAVING DUMMY TERMINALS OR COMMON POTENTIAL TERMINALS

(71) Applicant: AUO Corporation, Hsin-Chu (TW)

(72) Inventors: Chi-Cheng Chen, Hsin-Chu (TW); Chun-Fan Chung, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 0 days.

(21) Appl. No.: 18/540,948

(22) Filed: Dec. 15, 2023

(65) Prior Publication Data
US 2024/0353941 A1 Oct. 24, 2024

(30) Foreign Application Priority Data
Apr. 19, 2023 (TW) .................................. 112114587

(51) Int. Cl.
*G06F 3/041* (2006.01)
*G06F 3/044* (2006.01)
*H05K 1/02* (2006.01)

(52) U.S. Cl.
CPC ............ *G06F 3/0412* (2013.01); *G06F 3/044* (2013.01); *H05K 1/028* (2013.01)

(58) Field of Classification Search
CPC ......... G06F 3/0412; G06F 3/044–0448; G06F 2203/04102–04104; G06F 2203/04107; G06F 2203/04113; H05K 1/0277–0283; H05K 1/118; H05K 1/14; H05K 1/147; H05K 1/148; H05K 1/189; H05K 2201/09409; H05K 2201/09781
See application file for complete search history.

(56) References Cited

U.S. PATENT DOCUMENTS

2005/0140618 A1* 6/2005 Kang ................... G09G 3/3688
345/87
2006/0033852 A1* 2/2006 Kim ...................... G09G 3/006
349/38

(Continued)

FOREIGN PATENT DOCUMENTS

| TW | 201712497 A | 4/2017 |
| TW | 201918850 A | 5/2019 |
| TW | 202209060 A | 3/2022 |

*Primary Examiner* — Nathan Danielsen
(74) *Attorney, Agent, or Firm* — WPAT, PC

(57) ABSTRACT

A display device includes an in-cell touch display panel, a flexible printed circuit board, and a source driver. The in-cell touch display panel includes touch sensing electrodes, touch sensing pins, pixel electrodes, and source pins. The touch sensing pins are electrically connected to the touch sensing electrodes. The source pins are electrically connected to the pixel electrodes. The flexible circuit board includes dummy pads, touch sensing leads, input pads, output pads, and output signal leads. The touch sensing leads are electrically connected to the dummy pads and the touch sensing pins. The output signal leads are electrically connected to the output pads and the source pins. The source driver includes input terminals and output terminals. The input terminals are electrically connected to the input pads. The output terminals are electrically connected to the output pads. The source driver does not include a touch sensing terminal.

20 Claims, 21 Drawing Sheets

(56) References Cited

U.S. PATENT DOCUMENTS

2011/0279986 A1* 11/2011 Doran .................... H05K 3/242
                                                                                                               361/749
2017/0090628 A1    3/2017  Liu
2019/0129555 A1    5/2019  Chiang
2022/0206608 A1*  6/2022  Shin .................... G06F 3/04164

* cited by examiner

DISPLAY DEVICE WITH SOURCE DRIVER HAVING DUMMY TERMINALS OR COMMON POTENTIAL TERMINALS

CROSS-REFERENCE TO RELATED APPLICATION

This application claims priority to Taiwan Application Serial Number 112114587, filed Apr. 19, 2023, which is herein incorporated by reference.

BACKGROUND

Technical Field

The present disclosure relates to a display device.

Description of Related Art

Touch display panels can be categorized into out-cell, on-cell, and in-cell touch display panels according to the arrangement of their touch sensing area. Among them, in-cell touch display panels do not require glass covers and are thin and lightweight. Therefore, technologies of in-cell touch display panels are becoming more extensively applied in tablets and laptops.

However, since the market for such an application is in development, maintaining the assembly lines of both in-cell touch display panels and pure display panels is essential yet requires quite high costs.

Accordingly, how to provide a display device to solve the aforementioned problems becomes an important issue to be solved by those in the industry.

SUMMARY

An aspect of the disclosure is to provide a display device that may efficiently solve the aforementioned problems.

According to an embodiment of the disclosure, a display device includes an in-cell touch display panel, a flexible printed circuit board, and a source driver. The in-cell touch display panel includes touch sensing electrodes, touch sensing pins, pixel electrodes, and source pins. The touch sensing electrodes are separated from one another. The touch sensing pins are electrically connected to the touch sensing electrodes. The source pins are electrically connected to the pixel electrodes. The flexible printed circuit board includes dummy pads, touch sensing leads, input pads, output pads, and output signal leads. The touch sensing leads are electrically connected to the dummy pads and the touch sensing pins of the in-cell touch display panel. The output signal leads are electrically connected to the output pads and the source pins of the in-cell touch display panel. The source driver includes input terminals and output terminals. The input terminals are electrically connected to the input pads of the flexible printed circuit board. The output terminals are electrically connected to the output pads of the flexible printed circuit board. The source driver does not include a touch sensing terminal.

According to another embodiment of the disclosure, a display device includes an in-cell touch display panel, a flexible printed circuit board, and a source driver. The in-cell touch display panel includes touch sensing electrodes, touch sensing pins, pixel electrodes, and source pins. The touch sensing electrodes are separated from one another. The touch sensing pins are electrically connected to the touch sensing electrodes. The source pins are electrically connected to the pixel electrodes. The flexible printed circuit board includes dummy pads, touch sensing leads, touch sensing pads, input pads, output pads, and output signal leads. The touch sensing leads are electrically connected to the touch sensing pins of the in-cell touch display panel. The touch sensing pads are electrically connected to the dummy pads and the touch sensing leads. The output signal leads are electrically connected to the output pads and the source pins of the in-cell touch display panel. The source driver includes input terminals and output terminals. The input terminals are electrically connected to the input pads of the flexible printed circuit board. The output terminals are electrically connected to the output pads of the flexible printed circuit board. The source driver does not include a touch sensing terminal.

According to yet another embodiment of the disclosure, a display device includes an in-cell touch display panel, a flexible printed circuit board, a source driver, and a common potential source. The in-cell touch display panel includes touch sensing electrodes, touch sensing pins, pixel electrodes, and source pins. The touch sensing electrodes are separated from one another. The touch sensing pins are electrically connected to the touch sensing electrodes. The source pins are electrically connected to the pixel electrodes. The flexible printed circuit board includes touch sensing leads, a common potential line, input pads, output pads, and output signal leads. The touch sensing leads are electrically connected to the touch sensing pins of the in-cell touch display panel. The common potential line is electrically connected to the touch sensing leads. The output signal leads are electrically connected to the output pads and the source pins of the in-cell touch display panel. The source driver includes input terminals and output terminals. The input terminals are electrically connected to the input pads of the flexible printed circuit board. The output terminals are electrically connected to the output pads of the flexible printed circuit board. The source driver does not include a touch sensing terminal. The common potential source is electrically connected to the touch sensing leads and the common potential line.

According to still another embodiment of the disclosure, a display device includes an in-cell touch display panel, a flexible printed circuit board, and a source driver. The in-cell touch display panel includes touch sensing electrodes, touch sensing pins, pixel electrodes, and source pins. The touch sensing electrodes are separated from one another. The touch sensing pins are electrically connected to the touch sensing electrodes. The source pins are electrically connected to the pixel electrodes. The flexible printed circuit board includes touch sensing leads, a common potential line, a common potential source, input pads, output pads, and output signal leads. The touch sensing leads are electrically connected to the touch sensing pins of the in-cell touch display panel. The common potential line is electrically connected to the touch sensing leads. The common potential source is electrically connected to the touch sensing leads. The output signal leads are electrically connected to the output pads and the source pins of the in-cell touch display panel. The source driver includes input terminals and output terminals. The input terminals are electrically connected to the input pads of the flexible printed circuit board. The output terminals are electrically connected to the output pads of the flexible printed circuit board. The source driver does not include a touch sensing terminal.

Accordingly, in the display devices of some embodiments of the present disclosure, by disposing dummy pads, the wiring between the flexible printed circuit boards and the source drivers can be more flexible. In addition, by combining different flexible printed circuit boards and source drivers and coupling them with the same in-cell touch display panels, both pure display device and touch display device may be achieved. To be more specific, in the display devices of some embodiments of the present disclosure, the flexible printed circuit boards may or may not include touch sensing pads. Also, the source drivers may or may not include touch sensing terminals. Therefore, by changing the wiring, dummy terminals or common potential terminals are disposed on the source drivers so that signals transmitted through the touch sensing pads and the touch sensing leads can be touch sensing signals or common potential signals. As such, in the fabrication of display devices, in-cell touch display panels can be fabricated on the main assembly line, while the number of pure display panels fabricated may be cut down gradually and thus reducing development costs.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
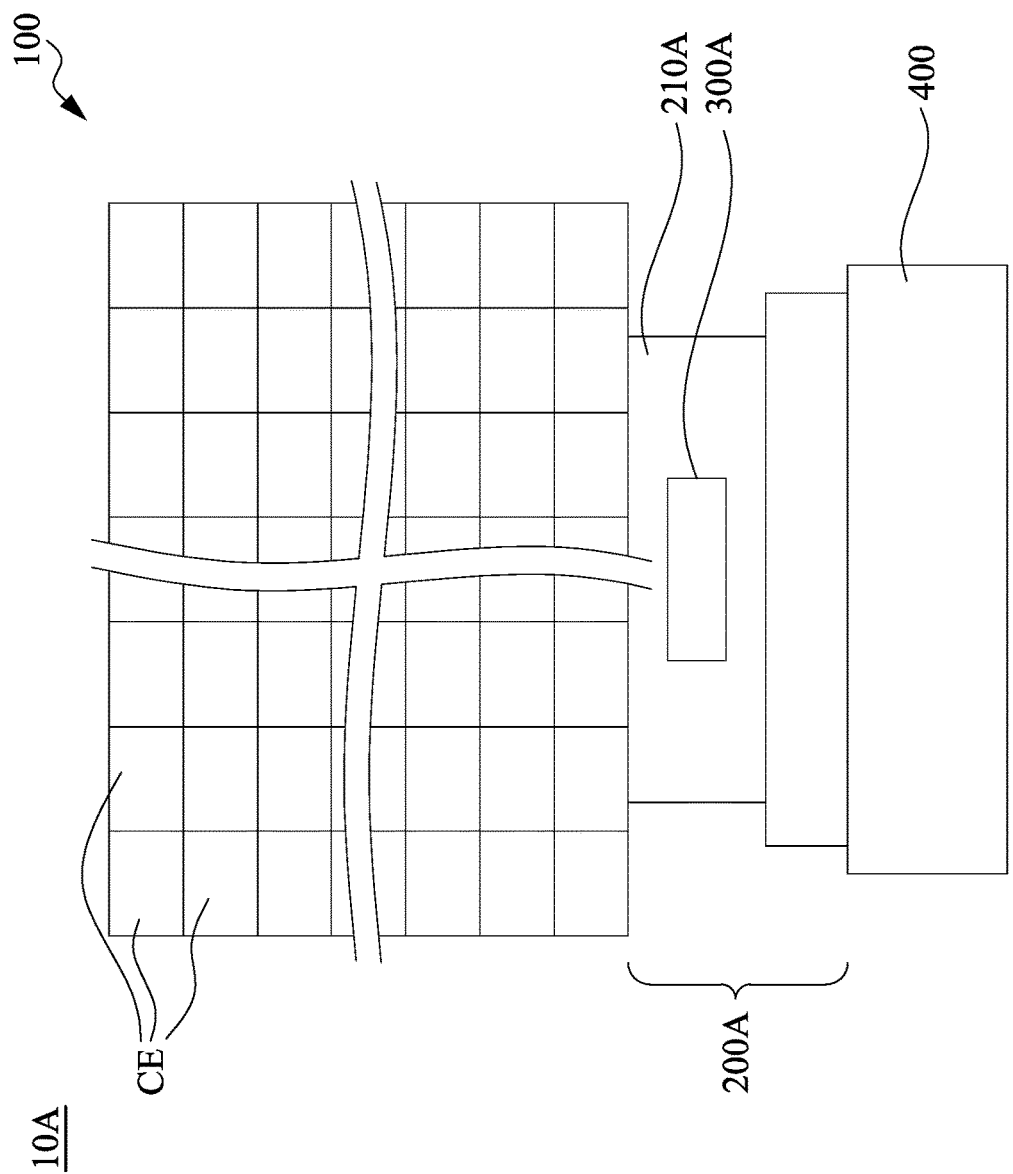
FIG. 1 is a schematic diagram of a display device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Reference is made to FIG. 1. FIG. 1 is a schematic diagram of a display device 10A according to some embodiments of the present disclosure. It should be noted that some components of the display device 10A are omitted from FIG. 1 for clarity. As shown in FIG. 1, the display device 10A includes a pixel array substrate such as an in-cell touch display panel 100 (ITP), a flexible printed circuit board 200A (FPCB), and a source driver 300A. As shown in FIG. 1, the in-cell touch display panel 100 is electrically connected to the flexible printed circuit board 200A. The source driver 300A is disposed on the flexible printed circuit board 200A. In some embodiments, the flexible printed circuit board 200A is coupled with the source driver 300A to form a chip on film (COF) structure. As shown in FIG. 1, the display device 10A may further include a printed circuit board assembly 400 (PCBA). As shown in FIG. 1, the in-cell touch display panel 100 includes a plurality of common electrodes CE.

In the subsequent drawings, some components of the in-cell touch display panel 100, the flexible printed circuit board 200A, and the source driver 300A are omitted for clarity. In addition, in the drawings of the flexible printed circuit board 200A, only a portion 210A where the flexible printed circuit board 200A and the source driver 300A are connected is shown. In some other embodiments, similar techniques are used for illustration.

Figure 2:
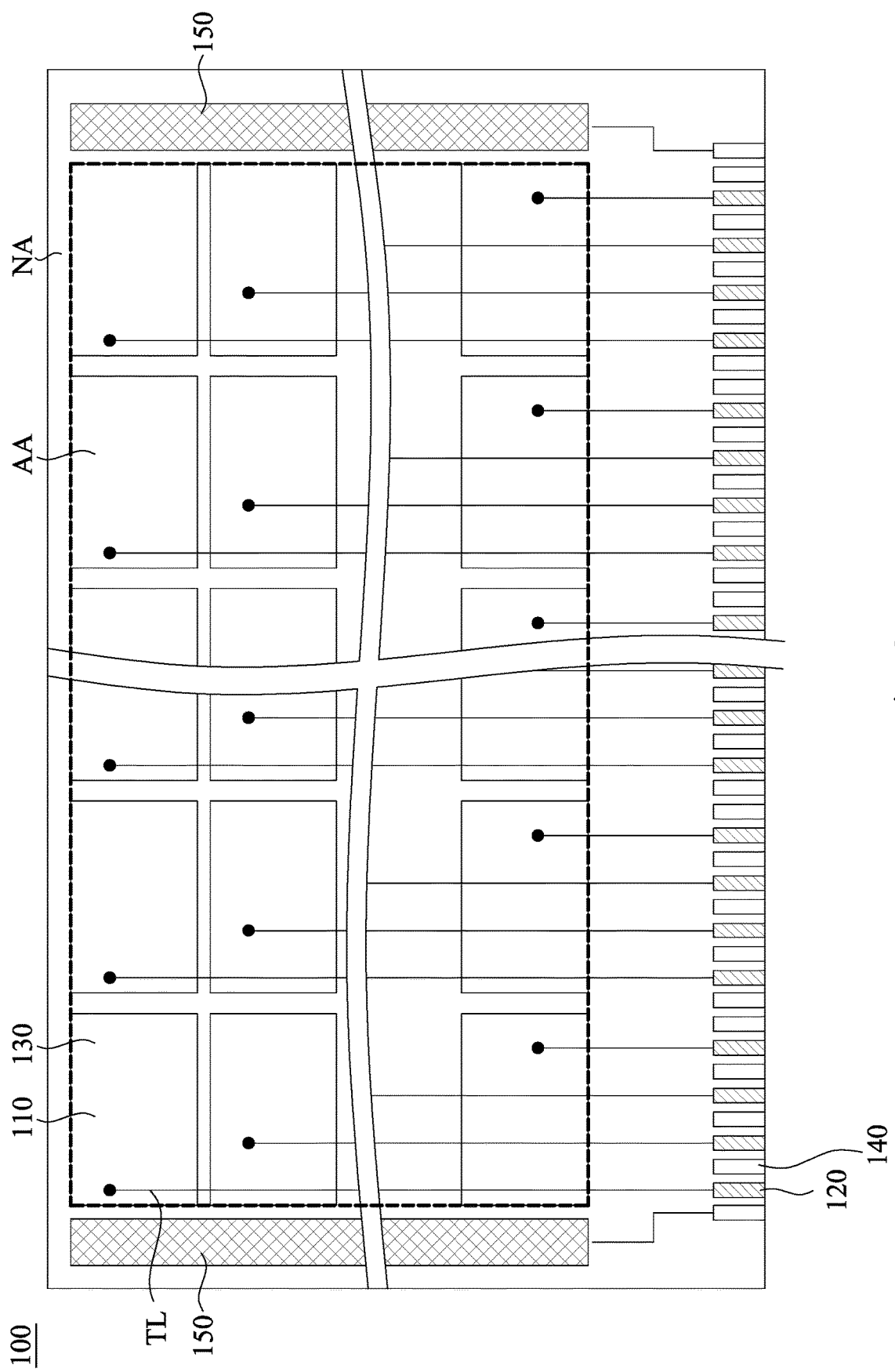
FIG. 2 is a schematic diagram of an in-cell touch display panel according to some embodiments of the present disclosure.

Reference is made to FIG. 2. FIG. 2 is a schematic diagram of the in-cell touch display panel 100 according to some embodiments of the present disclosure. As shown in FIG. 2, the in-cell touch display panel 100 includes an active area AA and a non-display area NA. The non-display area NA surrounds the active area AA. As shown in FIG. 2, the in-cell touch display panel 100 further includes a plurality of touch sensing electrodes 110, a plurality of touch sensing pins 120, a plurality of pixel electrodes 130, a plurality of source pins 140, and a gate drive on array 150 (GOA).

As shown in FIG. 2, the touch sensing electrodes 110 are disposed separated from one another in the active area AA.

In some embodiments, the touch sensing electrodes 110 form an array. The touch sensing pins 120 are electrically connected to the touch sensing electrodes 110. As shown in FIG. 2, the touch sensing pins 120 are electrically connected to their corresponding one of the touch sensing electrodes 110 through the touch sensing line TL. The touch sensing line TL passes through and overlaps at least one of the touch sensing electrodes 110. Similarly, the source pins 140 are electrically connected to their corresponding one of the pixel electrodes 130. In some embodiments, as shown in FIG. 2, the touch sensing pins 120 and the source pins 140 are staggered and disposed on one side of the active area AA.

Generally speaking, the in-cell touch display panel 100 is a substrate formed with a plurality of sub-pixels. The sub-pixels are disposed in the active area AA and have at least one common electrode CE (referring to FIG. 1) and at least one of the pixel electrodes 130. In some embodiments, the touch sensing electrode 110 can be used as the common electrode CE of the sub-pixels. In addition to their application in display, the touch sensing electrodes 110 may also be used for touch sensing functions. This can be accomplished using commonly known techniques, so no further details will be provided. It should be noted that in some embodiments, the touch sensing electrodes 110 at least partially overlap the pixel electrodes 130. For example, as shown in FIG. 2, the touch sensing electrodes 110 and the pixel electrodes 130 are overlapping arrays. In other words, the touch sensing electrodes 110 and the pixel electrodes 130 are disposed one-to-one in the active area AA.

In some embodiments, the touch sensing electrodes 110 and the pixel electrode 130s may be a transparent conductive layer. For example, the touch sensing electrodes 110 and the pixel electrodes 130 may include a transparent metal oxide, such as indium tin oxide (ITO), indium zinc oxide (IZO), or the like.

Figure 3:
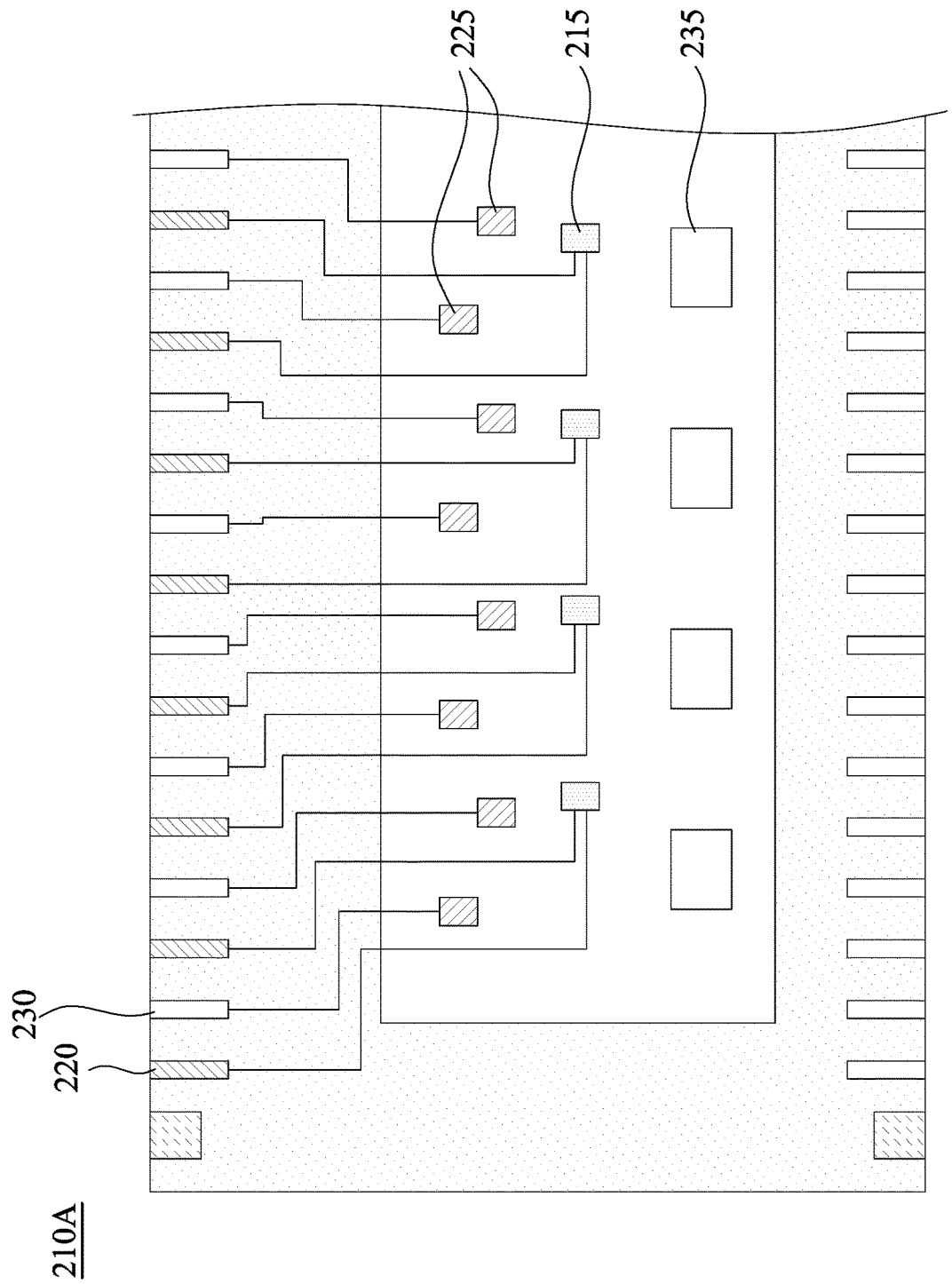
FIG. 3 is a schematic diagram of a portion of a flexible printed circuit board according to some embodiments of the present disclosure.

Reference is made to FIG. 3. FIG. 3 is a schematic diagram of the portion 210A of the flexible printed circuit board 200A according to some embodiments of the present disclosure. As shown in FIG. 3, the portion 210A includes a plurality of dummy pads 215, a plurality of touch sensing leads 220, a plurality of output pads 225, a plurality of output signal leads 230, and a plurality of input pads 235. As shown in FIG. 3, one end of each of the touch sensing leads 220 is electrically connected to its corresponding one of the dummy pads 215. The other end of the touch sensing lead 220 is electrically connected to one end of its corresponding one of the touch sensing pins 120 on the in-cell touch display panel 100 away from the active area AA (referring to FIG. 2). Similarly, one end of the output signal lead 230 is electrically connected to the output pad 225, and the other end of the output signal lead 230 is electrically connected to one end of the corresponding one of the source pins 140 on the in-cell touch display panel 100 away from the active area AA (referring to FIG. 2).

It should be noted that although the dummy pads 215, the output pads 225, and the input pads 235 are partitioned and regularly arranged in FIG. 3, in some embodiments, the dummy pads 215, the output pads 225, and the input pads 235 may be dispersed and/or scattered on the portion 210A without departing from the scope of the present disclosure.

Figure 4:
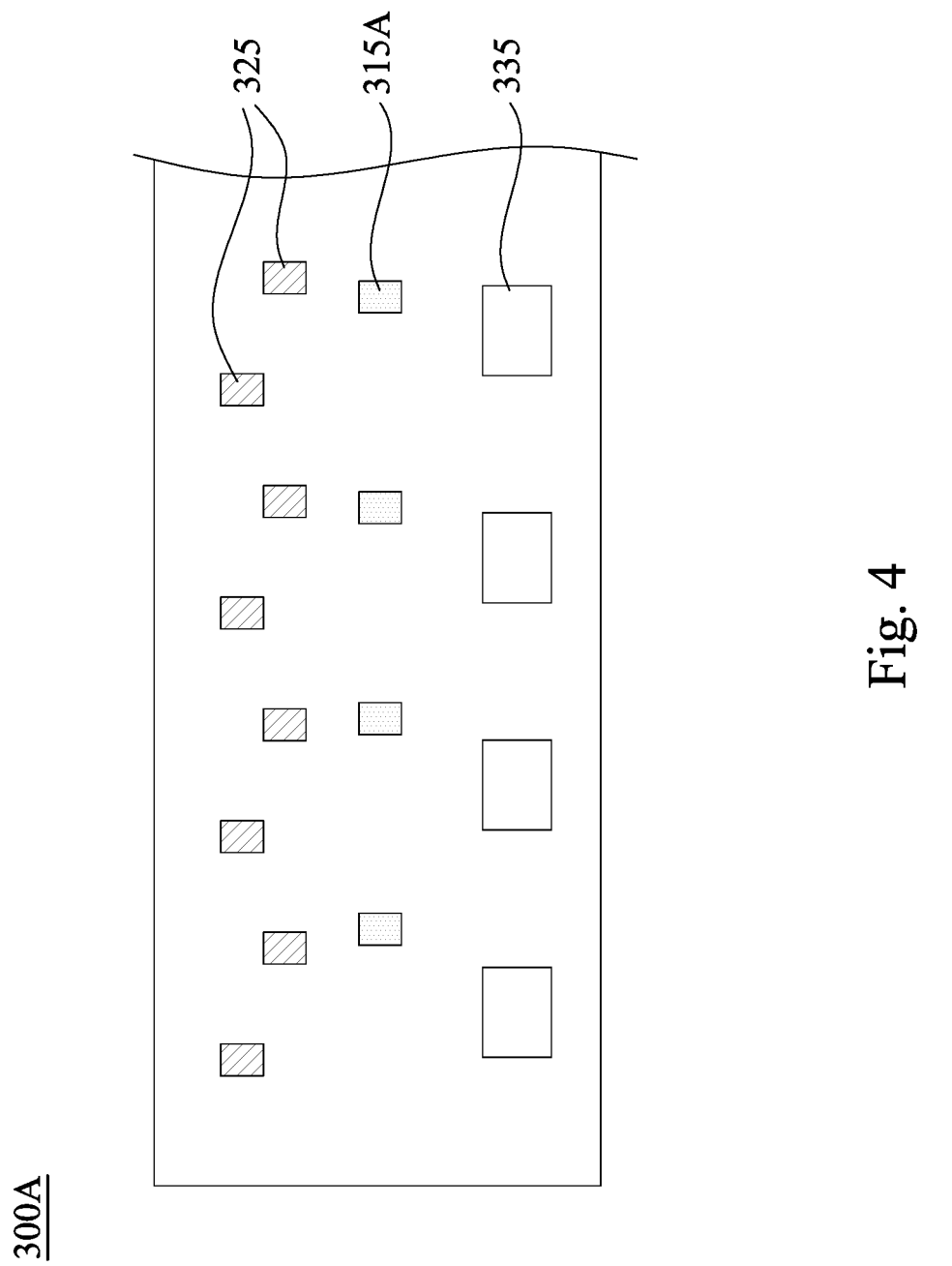
FIG. 4 is a schematic diagram of a source driver according to some embodiments of the present disclosure.

Reference is made to FIG. 4. FIG. 4 is a schematic diagram of the source driver 300A according to some embodiments of the present disclosure. As shown in FIG. 4, the source driver 300A includes a plurality of output terminals 325 and a plurality of input terminals 335. The input terminals 335 are electrically connected to the input pads 235 of the portion 210A (referring to FIG. 3). The output terminals 325 are electrically connected to the output pads 225 of the portion 210A (referring to FIG. 3). In some embodiments, as shown in FIG. 3, the source driver 300A further includes a plurality of common potential terminals 315A. The common potential terminals 315A are electrically connected to the dummy pads 215 of the portion 210A.

For example, in the display device 10A of some embodiments, the touch sensing pins 120 of the in-cell touch display panel 100 are electrically connected to one another. Moreover, a common potential (Vcom) is provided by the common potential terminals 315A of the source driver 300A.

For example, in the display device 10A of some embodiments, the common potential terminals 315A of the source driver 300A are electrically connected to one another and provide a common potential.

Figure 10:
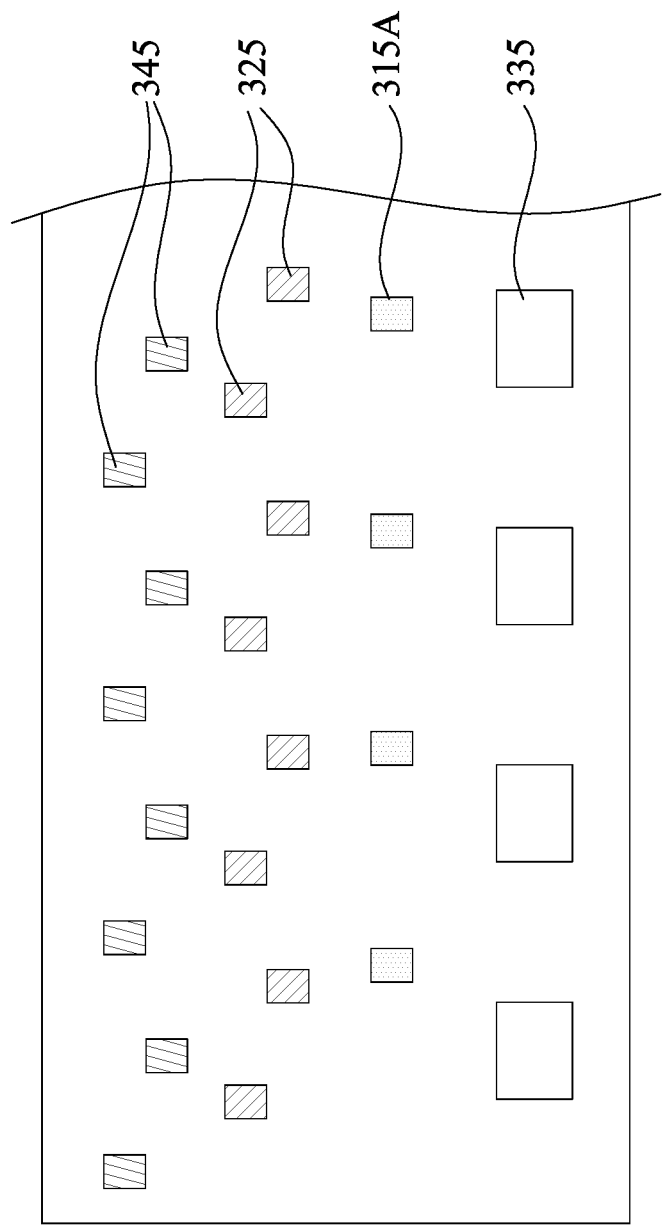
FIG. 10 is a schematic diagram of a source driver according to some embodiments of the present disclosure.

It should be noted that in the display device 10A of some embodiments, the source driver 300A does not include a touch sensing terminal (e.g., the touch sensing terminals 345 in FIG. 10). Therefore, the display device 10A is for display purposes only.

Figure 5:
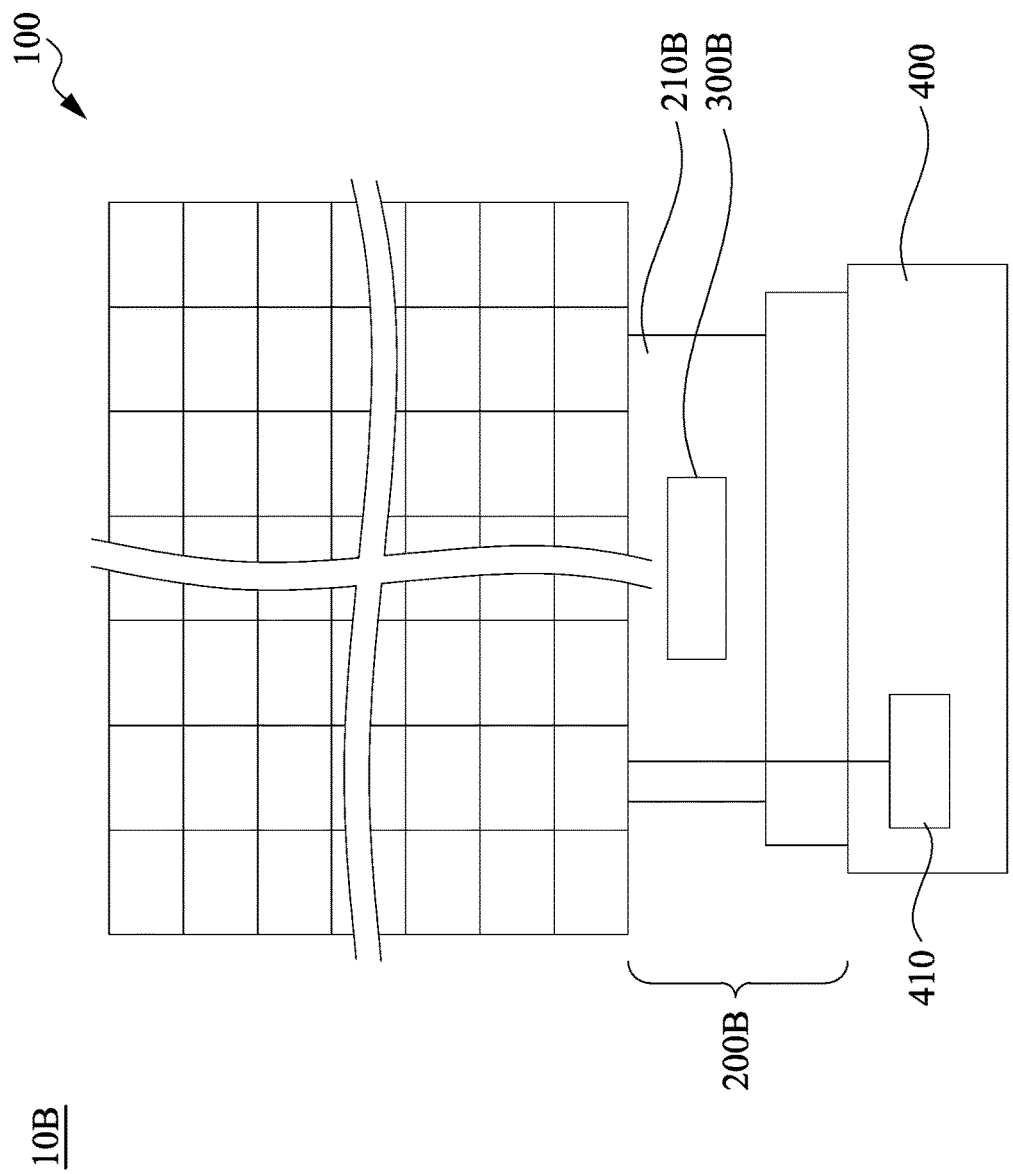
FIG. 5 is a schematic diagram of a display device according to some embodiments of the present disclosure.

Reference is made to FIG. 5. FIG. 5 is a schematic diagram of a display device 10B according to some embodiments of the present disclosure. The difference between the display device 10B and the display device 10A is that the display device 10B includes the in-cell touch display panel 100, a flexible printed circuit board 200B, and a source driver 300B. The flexible printed circuit board 200B includes a portion 210B. The printed circuit board assembly 400 further includes a common potential source 410. In some embodiments, the common potential source 410 is a power management integrated circuit (PMIC).

Figure 6:
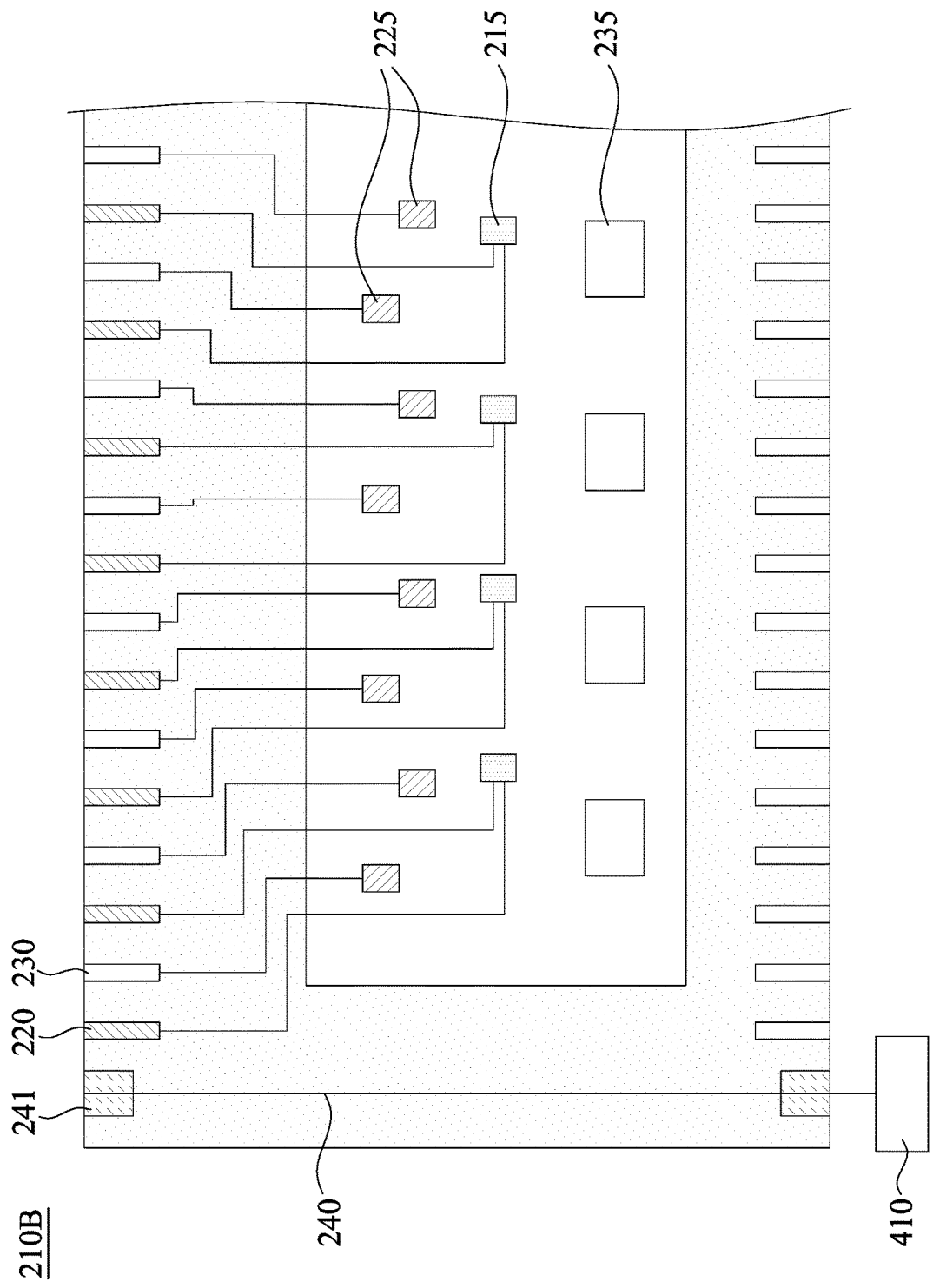
FIG. 6 is a schematic diagram of a portion of a flexible printed circuit board according to some embodiments of the present disclosure.

Reference is made to FIG. 6. FIG. 6 is a schematic diagram of the portion 210B of the flexible printed circuit board 200B according to some embodiments of the present disclosure. The difference between the portion 210B and the portion 210A is that the portion 210B further includes a bypass line 240 and a bypass line lead 241. The bypass line 240 is electrically connected to the common potential source 410 and electrically connected to at least one of the touch sensing leads 220 through the bypass line lead 241.

Figure 7:
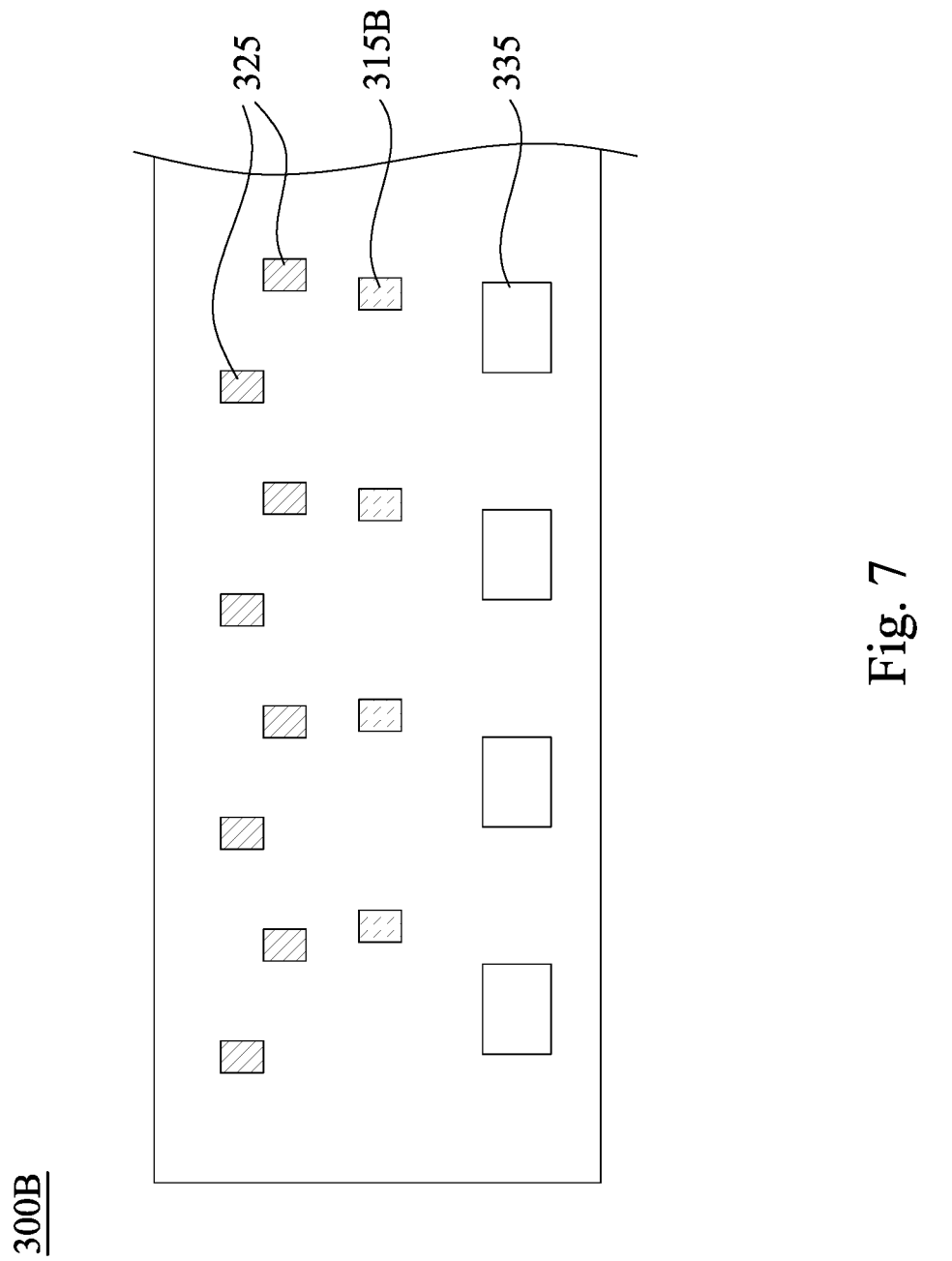
FIG. 7 is a schematic diagram of a source driver according to some embodiments of the present disclosure.

Reference is made to FIG. 7. FIG. 7 is a schematic diagram of the source driver 300B according to some embodiments of the present disclosure. The difference between the source driver 300B and the source driver 300A is that the source driver 300B includes a plurality of dummy terminals 315B, a plurality of output terminals 325, and a plurality of input terminals 335. Similar to the common potential terminals 315A, the dummy terminals 315B are electrically connected to the dummy pads 215 of the portion 210B (referring to FIG. 6). However, the dummy terminals 315B may be floating or electrically connected to one another. Therefore, in the display device 10B of some embodiments, the touch sensing pins 120 of the in-cell touch display panel 100 are electrically connected to one another. A common potential is provided by the common potential source 410 of the printed circuit board assembly 400. Meanwhile, similar to the display device 10A, the display device 10B is for display purposes only.

Figure 8:
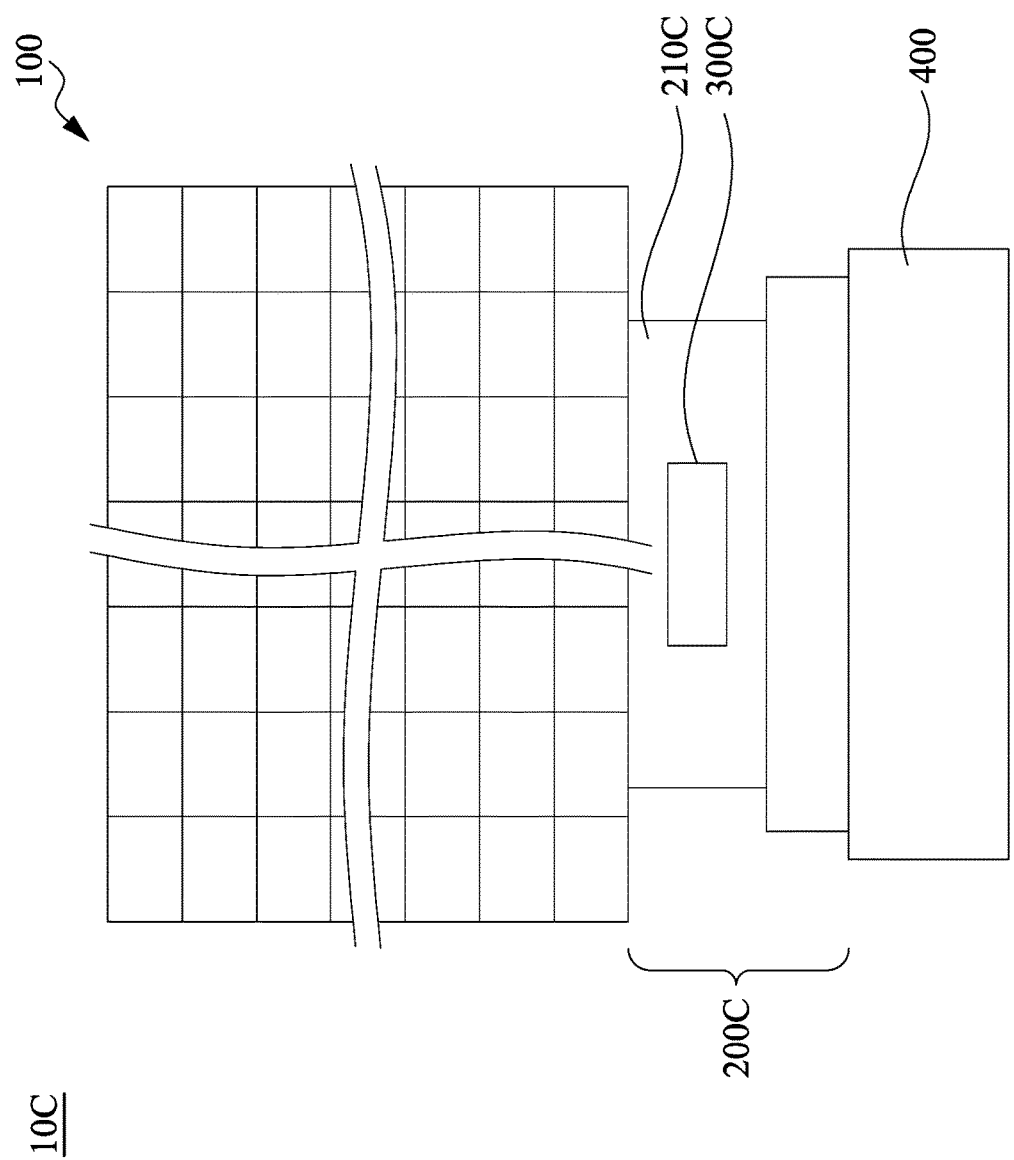
FIG. 8 is a schematic diagram of a display device according to some embodiments of the present disclosure.

Reference is made to FIG. 8. FIG. 8 is a schematic diagram of a display device 10C according to some embodiments of the present disclosure. As shown in FIG. 8, the display device 10C includes the in-cell touch display panel 100, a flexible printed circuit board 200C, and a source driver 300C. The flexible printed circuit board 200C includes a portion 210C.

Figure 9:
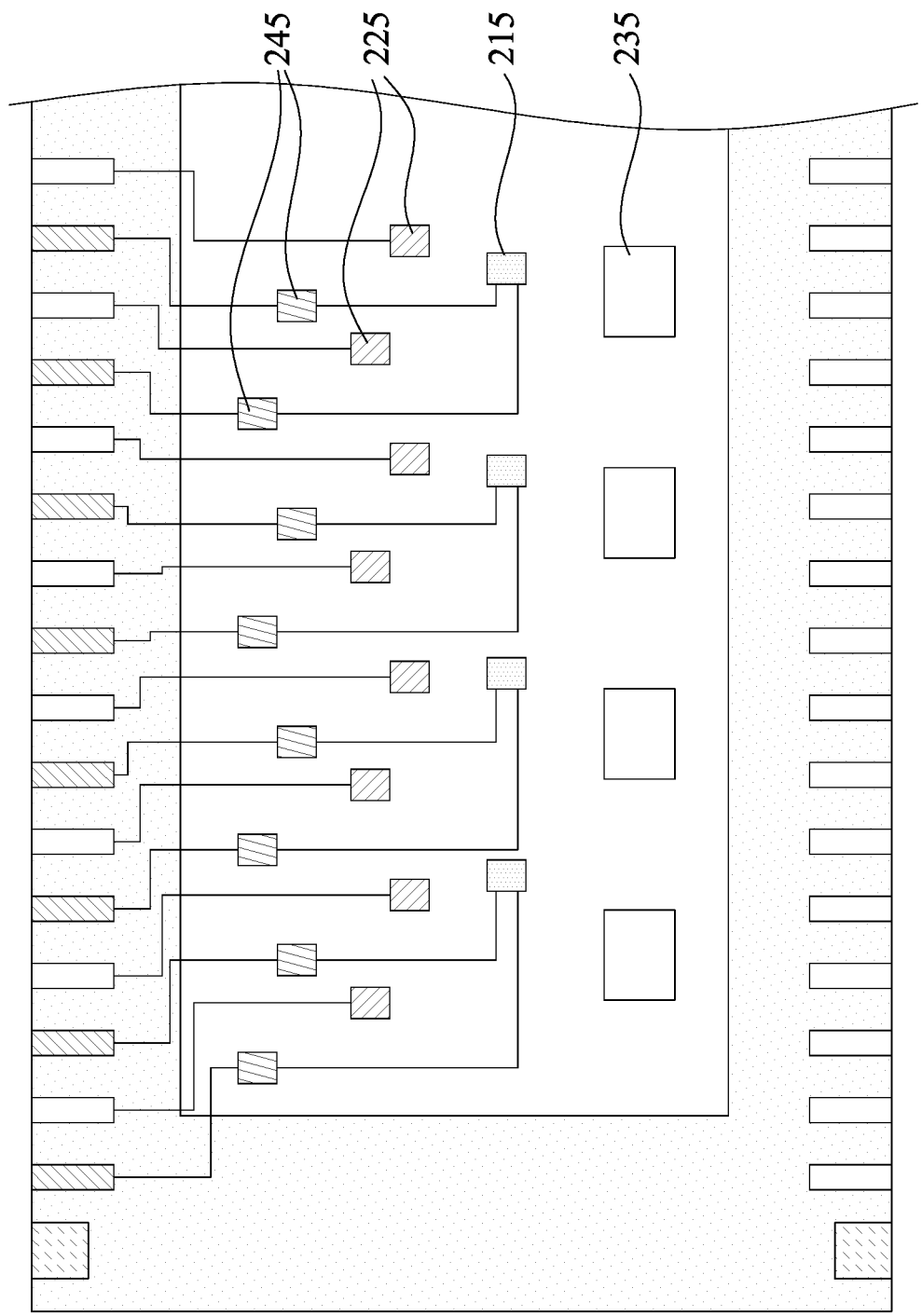
FIG. 9 is a schematic diagram of a portion of a flexible printed circuit board according to some embodiments of the present disclosure.

Reference is made to FIG. 9. FIG. 9 is a schematic diagram of the portion 210C of the flexible printed circuit board 200C according to some embodiments of the present disclosure. The difference between the portion 210C and the portion 210A is that the portion 210C further includes a plurality of touch sensing pads 245. The touch sensing pads 245 are electrically connected to the dummy pads 215 and electrically connected to one end of their corresponding one of the touch sensing leads 220. In some embodiments, some of the touch sensing pads 245 may be electrically connected to the same dummy pad 215.

Reference is made to FIG. 10. FIG. 10 is a schematic diagram of the source driver 300C according to some embodiments of the present disclosure. The difference between the source driver 300C and the source driver 300A is that the source driver 300C further includes a plurality of touch sensing terminals 345, which are electrically connected to the touch sensing pads 245 of the portion 210C (referring to FIG. 9).

For example, in the display device 10C in some embodiments, the touch sensing pins 120 of the in-cell touch display panel 100 are electrically connected to one another. A common potential is provided by the common potential terminals 315A of the source driver 300C.

For example, in the display device 10C of some embodiments, the common potential terminals 315A of the source driver 300C are electrically connected to one another and provide a common potential.

It should be noted that since the display device 10C has a touch sensing circuit, it can be used for touch display purposes. However, the source driver 300C can be replaced with the source driver 300A, so that the display device 10C is converted from a touch display device into a pure display device.

Figure 11:
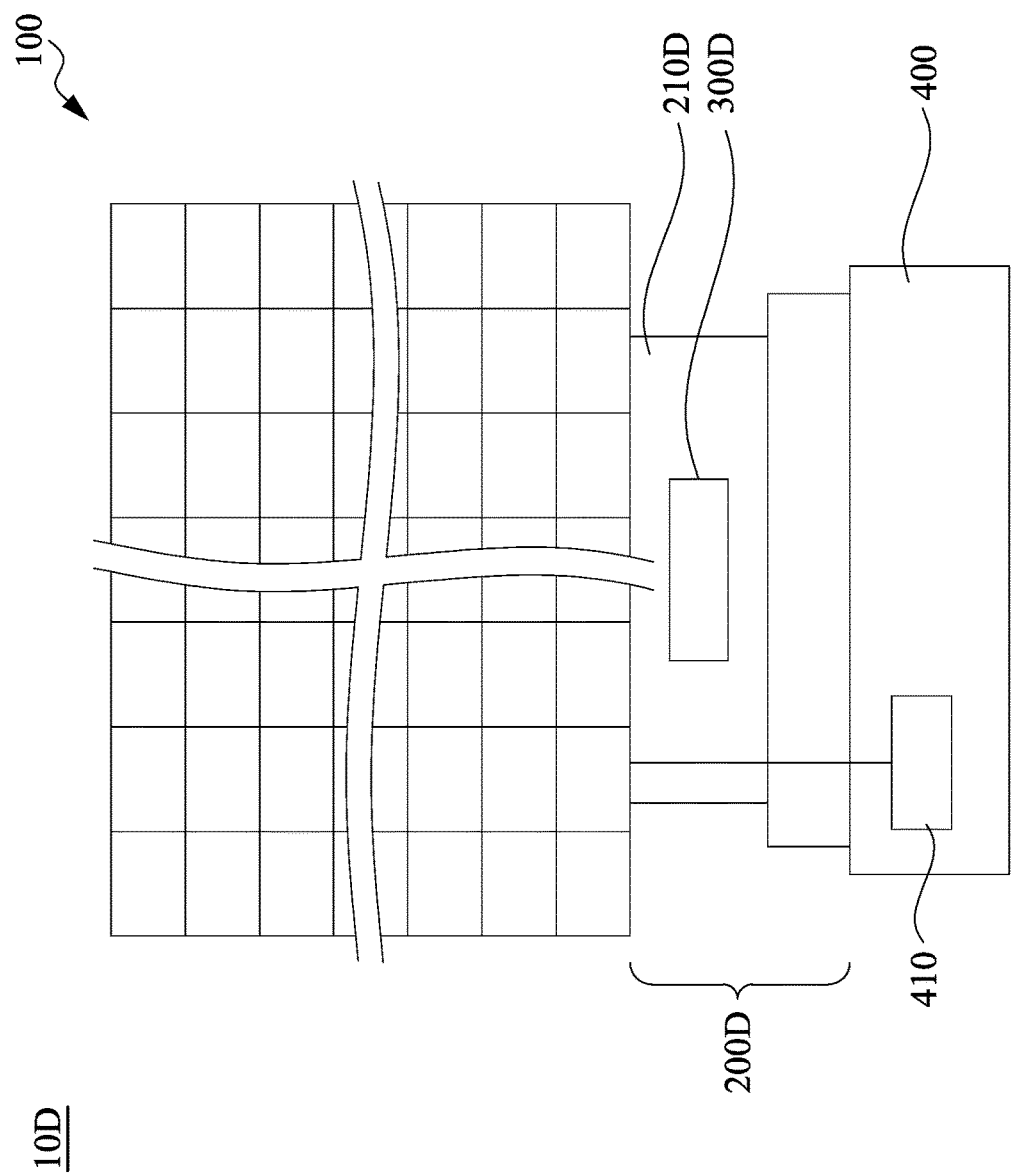
FIG. 11 is a schematic diagram of a display device according to some embodiments of the present disclosure.

Reference is made to FIG. 11. FIG. 11 is a schematic diagram of a display device 10D according to some embodiments of the present disclosure. The difference between the display device 10D and the display device 10C is that the display device 10D includes the in-cell touch display panel 100, a flexible printed circuit board 200D, and a source driver 300D. The flexible printed circuit board 200D includes a portion 210D. The printed circuit board assembly 400 further includes the common potential source 410.

Figure 12:
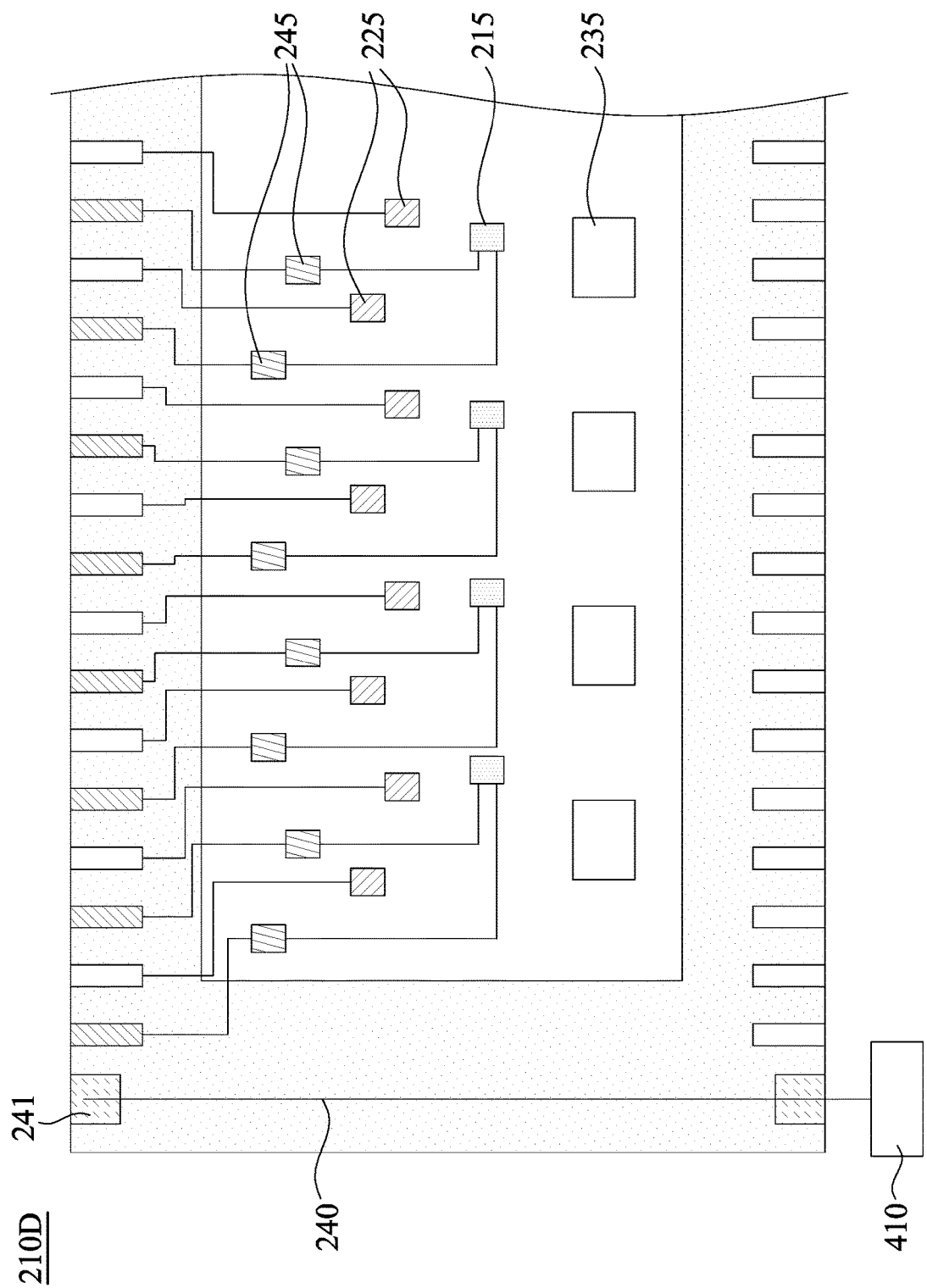
FIG. 12 is a schematic diagram of a portion of a flexible printed circuit board according to some embodiments of the present disclosure.

Reference is made to FIG. 12. FIG. 12 is a schematic diagram of the portion 210D of the flexible printed circuit board 200D according to some embodiments of the present disclosure. The difference between the portion 210D and the portion 210C is that the portion 210D further includes the bypass line 240 and the bypass line lead 241. The bypass line 240 is electrically connected to the common potential source 410 and electrically connected to at least one of the touch sensing leads 220 through the bypass line lead 241.

Figure 13:
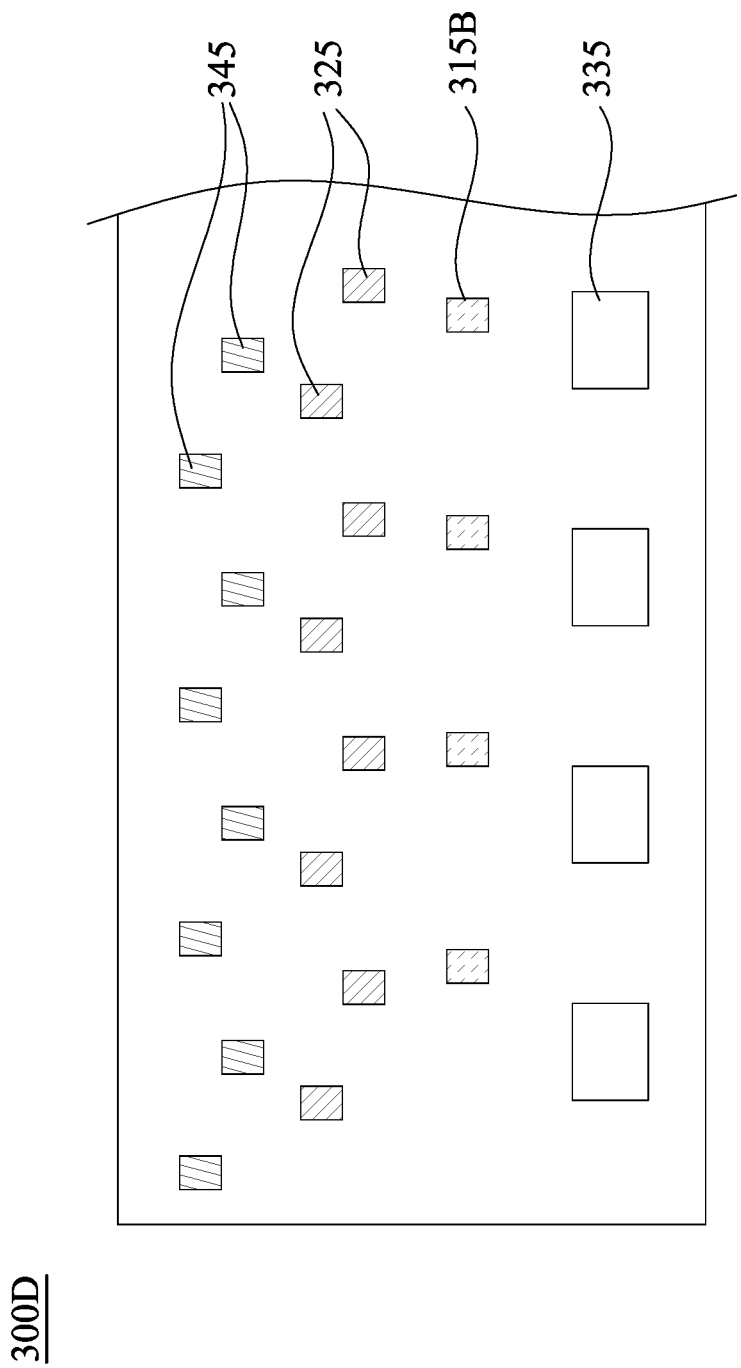
FIG. 13 is a schematic diagram of a source driver according to some embodiments of the present disclosure.

Reference is made to FIG. 13. FIG. 13 is a schematic diagram of the source driver 300D according to some embodiments of the present disclosure. The difference between the source driver 300D and the source driver 300C is that the source driver 300D includes a plurality of dummy terminals 315B, a plurality of output terminals 325, and a plurality of input terminals 335. Similar to the common potential terminals 315A, the dummy terminals 315B are electrically connected to the dummy pads 215 of the portion 210D (referring to FIG. 12). However, the dummy terminals 315B are electrically connected to one another.

For example, in the display device 10D of some embodiments, the touch sensing pins 120 of the in-cell touch display panel 100 are electrically connected to one another. A common potential is provided by the common potential source 410 of the printed circuit board assembly 400.

For example, in the display device 10D of some embodiments, the dummy terminals 315B of the source driver 300D are electrically connected to one another. A common potential is provided by the common potential source 410 of the printed circuit board assembly 400.

Figure 14:
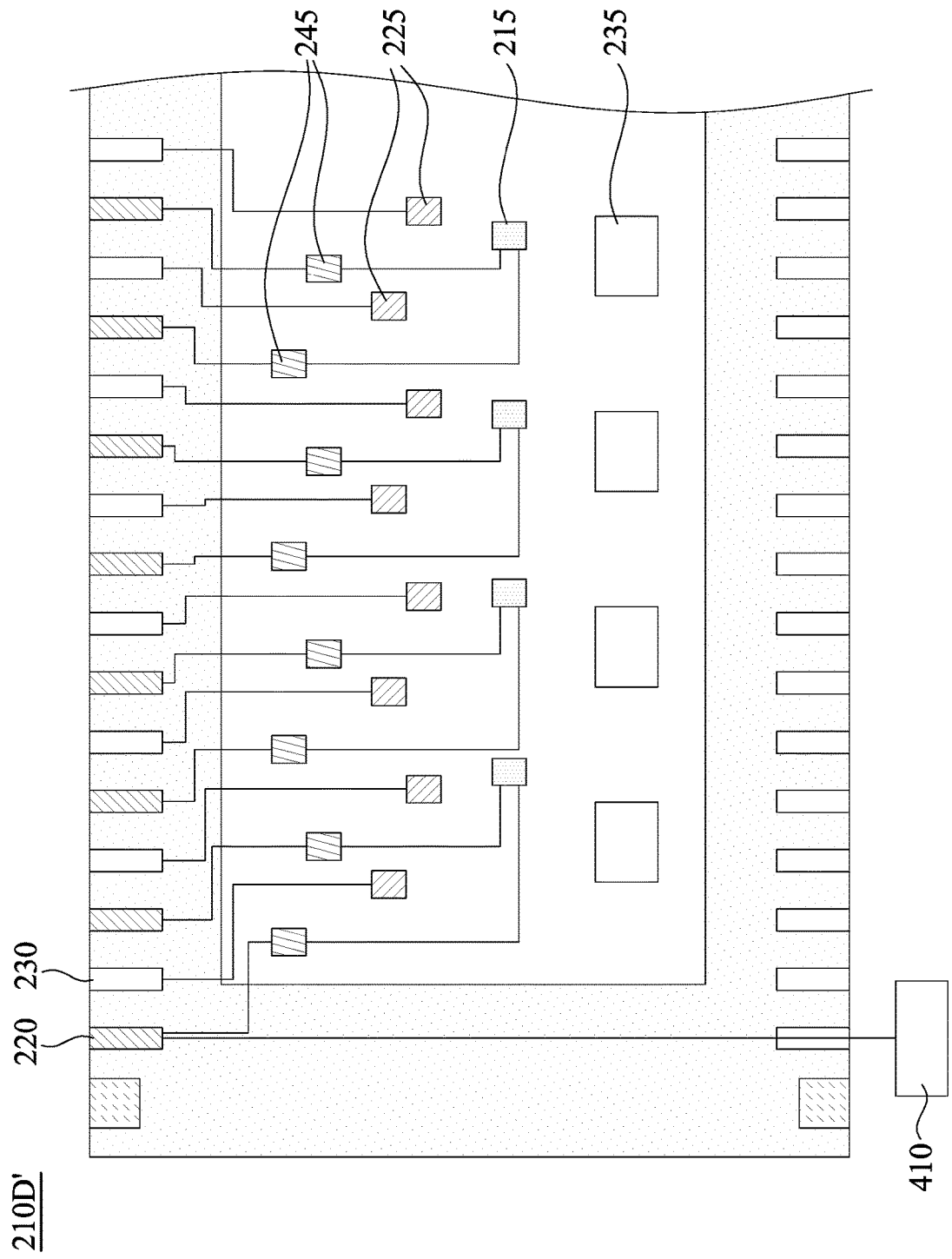
FIG. 14 is a schematic diagram of a portion of a flexible printed circuit board according to some embodiments of the present disclosure.

Reference is made to FIG. 14. FIG. 14 is a schematic diagram of a portion 210D' of the flexible printed circuit board 200D according to some embodiments of the present disclosure. In some embodiments of the display device 10D, the portion 210D can be replaced with the portion 210D', so that the common potential source 410 is directly electrically connected to at least one of the touch sensing leads 220 of the portion 210D'.

It should be noted that since the display device 10D has a touch sensing circuit, it can be used for touch display purposes. However, the source driver 300D can be replaced with the source driver 300B, so that the display device 10D is converted from a touch display device to a pure display device.

Figure 15:
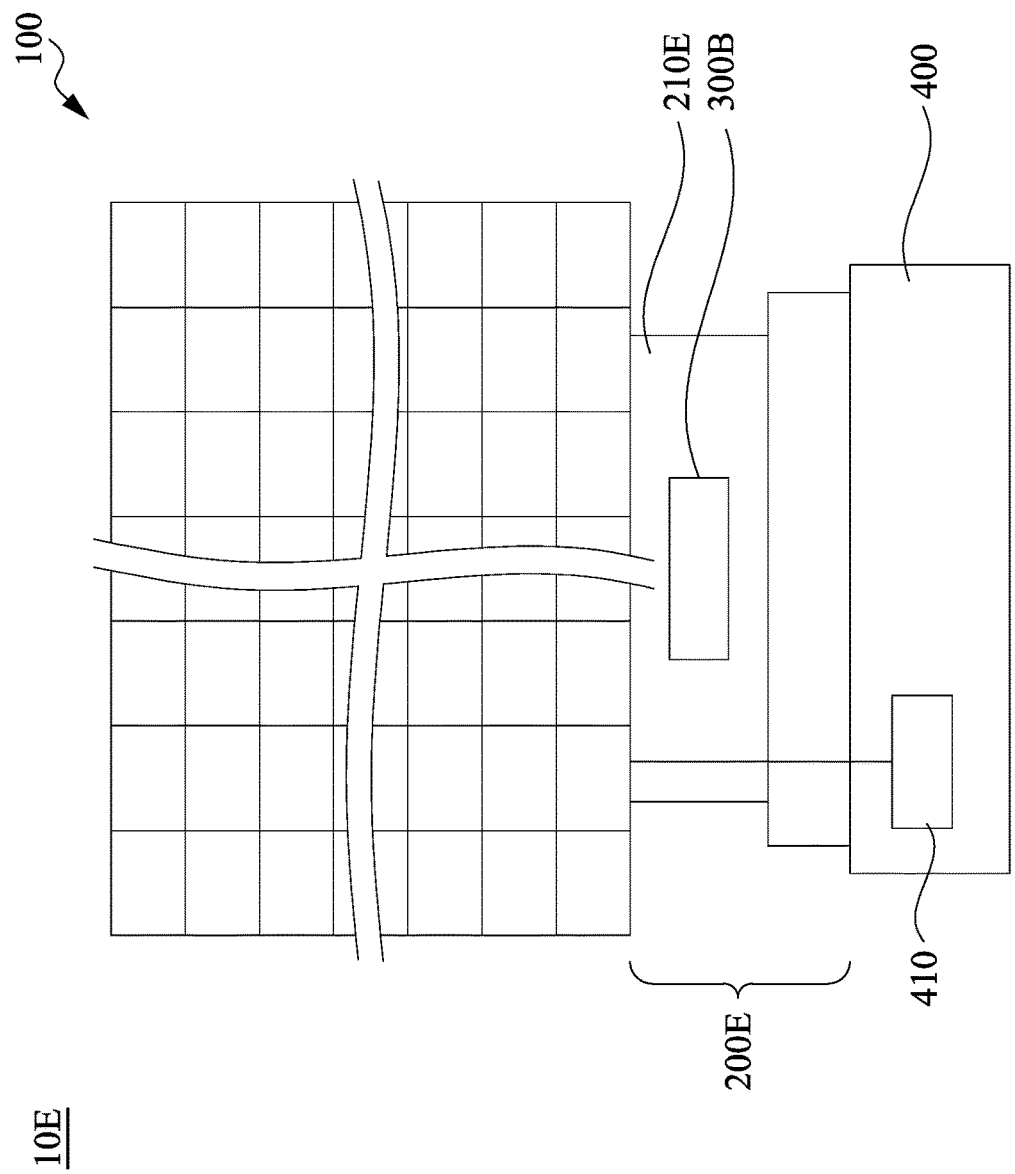
FIG. 15 is a schematic diagram of a display device according to some embodiments of the present disclosure.

Reference is made to FIG. 15. FIG. 15 is a schematic diagram of a display device 10E according to some embodiments of the present disclosure. As shown in FIG. 15, the difference between the display device 10E and the display device 10B is that the display device 10E includes the in-cell touch display panel 100, a flexible printed circuit board 200E, and the source driver 300B. The flexible printed circuit board 200E includes a portion 210E.

Figure 16:
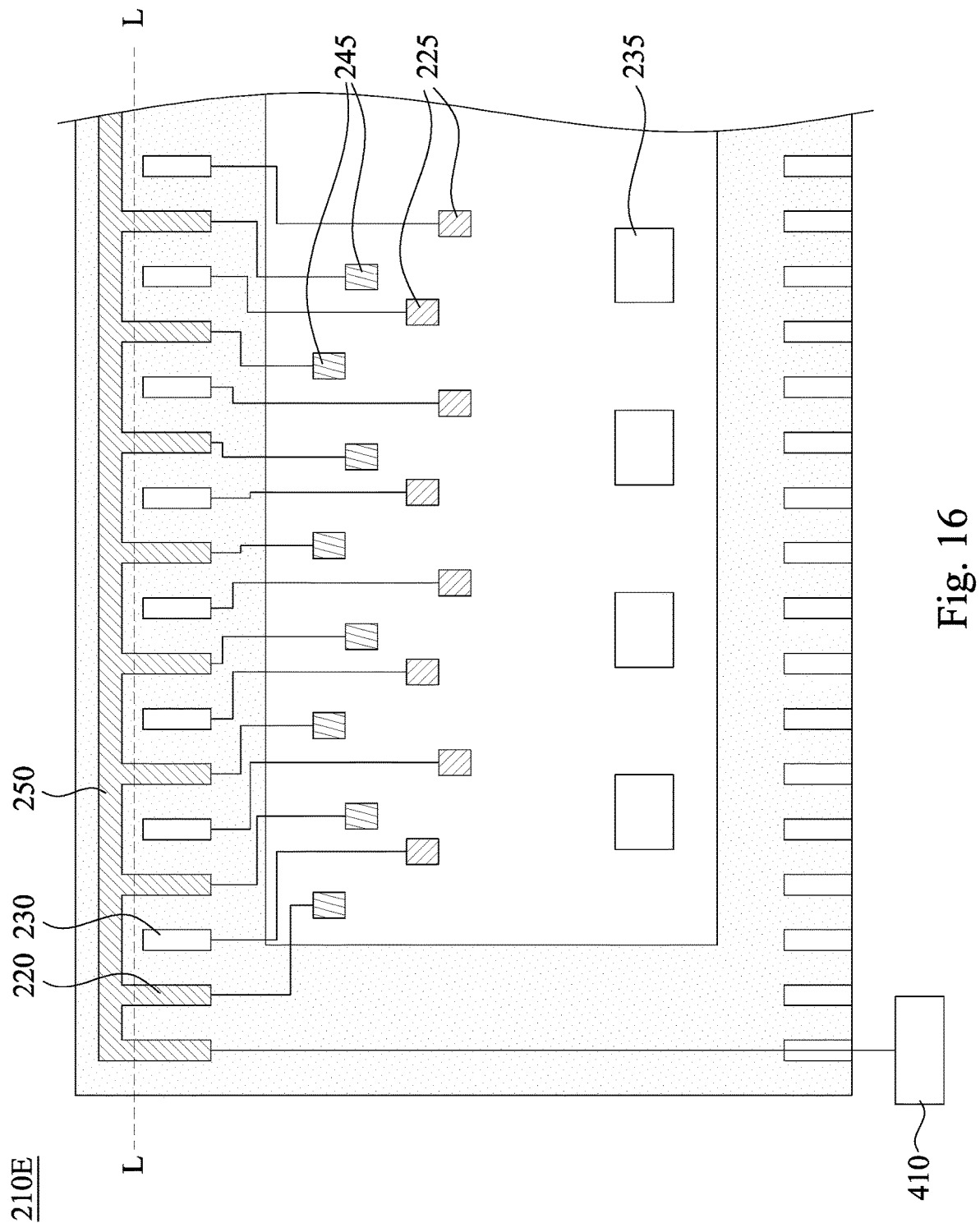
FIG. 16 is a schematic diagram of a portion of a flexible printed circuit board according to some embodiments of the present disclosure.

Reference is made to FIG. 16. FIG. 16 is a schematic diagram of the portion 210E of the flexible printed circuit board 200E according to some embodiments of the present disclosure. As shown in FIG. 16, the difference between the portion 210E and the portion 210D is that the portion 210E does not include the dummy pads 215, and the portion 210E includes a common potential line 250. The common potential line 250 is electrically connected to the touch sensing leads 220 of the portion 210E, as shown in FIG. 16.

In other words, in the display device 10E, the touch sensing leads 220 are electrically connected to one another through the common potential line 250. The common potential is provided by the common potential source 410. The dummy terminals 315B of the source driver 300B (referring to FIG. 7) is floating. In the display device 10E of some embodiments, the source driver 300B may not include the dummy terminals 315B.

It should be noted that since the source driver 300B does not have a touch sensing terminal (e.g., the touch sensing terminal 345 in FIG. 10), the display device 10E is for display purposes only. However, the portion 210E can be cut along a dotted line L in FIG. 16 to remove the common potential line 250 and replace the source driver 300B with the source driver 300D. As such, the display device 10E is converted from a pure display device to a touch display device.

Figure 17:
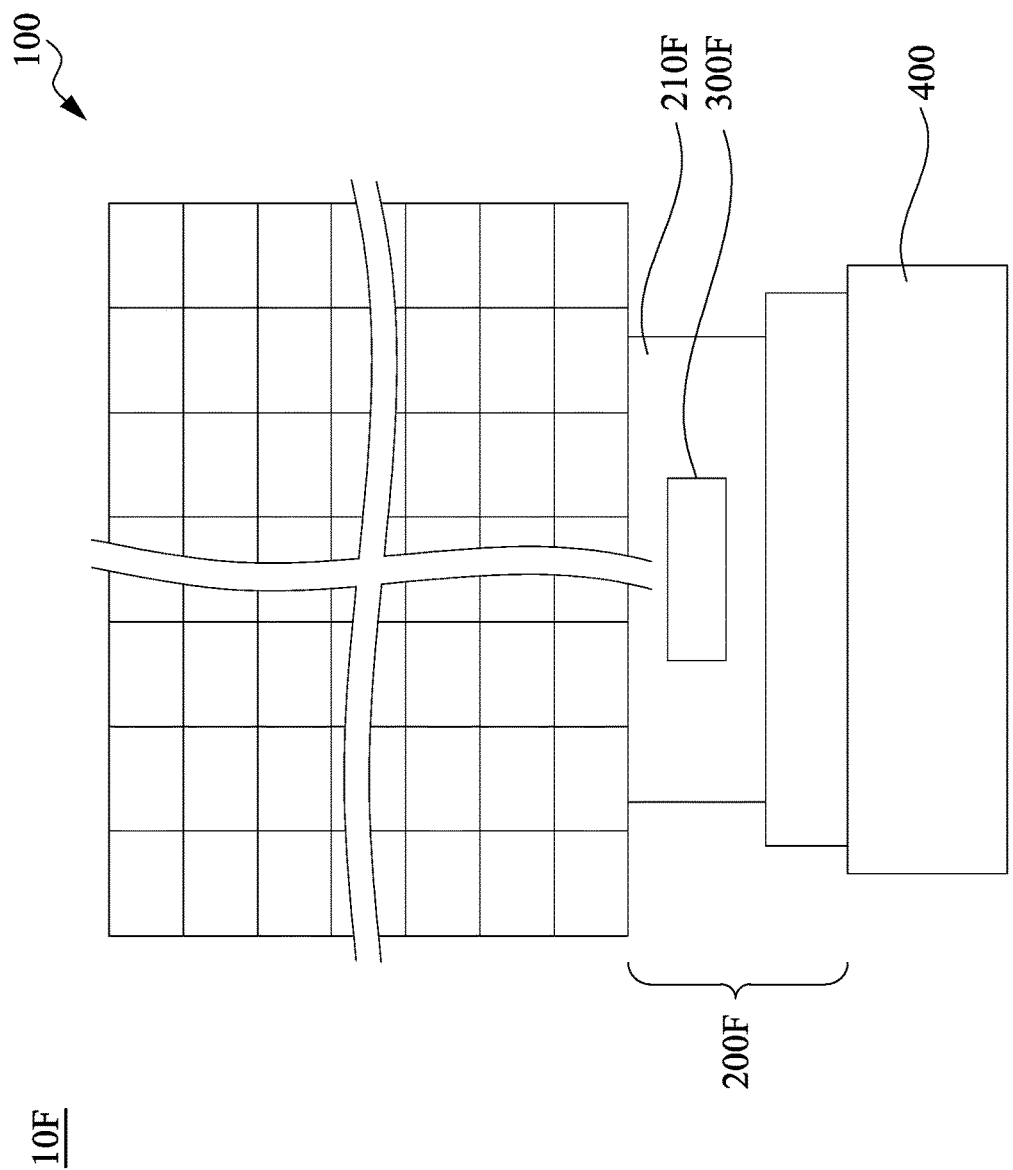
FIG. 17 is a schematic diagram of a display device according to some embodiments of the present disclosure.

Reference is made to FIG. 17. FIG. 17 is a schematic diagram of a display device 10F according to some embodiments of the present disclosure. As shown in FIG. 17, the difference between the display device 10F and the display device 10E is that the display device 10F includes the in-cell touch display panel 100, a flexible printed circuit board 200F, and a source driver 300F. The flexible printed circuit board 200F includes a portion 210F. The printed circuit board assembly 400 does not include a common potential source 410.

Figure 18:
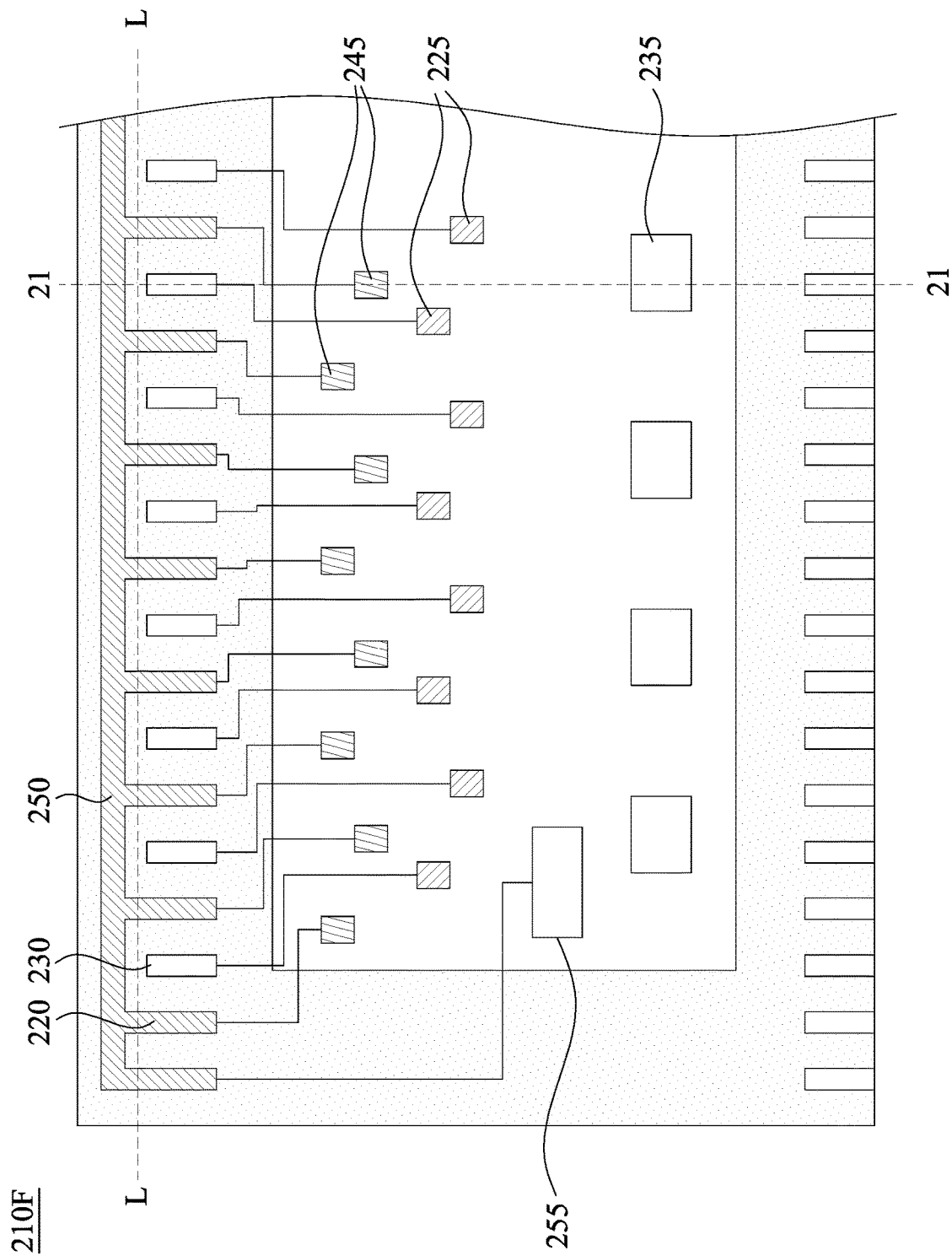
FIG. 18 is a schematic diagram of a portion of a flexible printed circuit board according to some embodiments of the present disclosure.

Reference is made to FIG. 18. FIG. 18 is a schematic diagram of the portion 210F of the flexible printed circuit board 200F according to some embodiments of the present disclosure. The difference between the portion 210F and the portion 210E is that the portion 210F includes a plurality of common potential pads 255. Compared with the portion 210E that electrically connects the common potential line 250 to the common potential source 410, the portion 210F electrically connects the common potential line 250 with the common potential pads 255.

Figure 19:
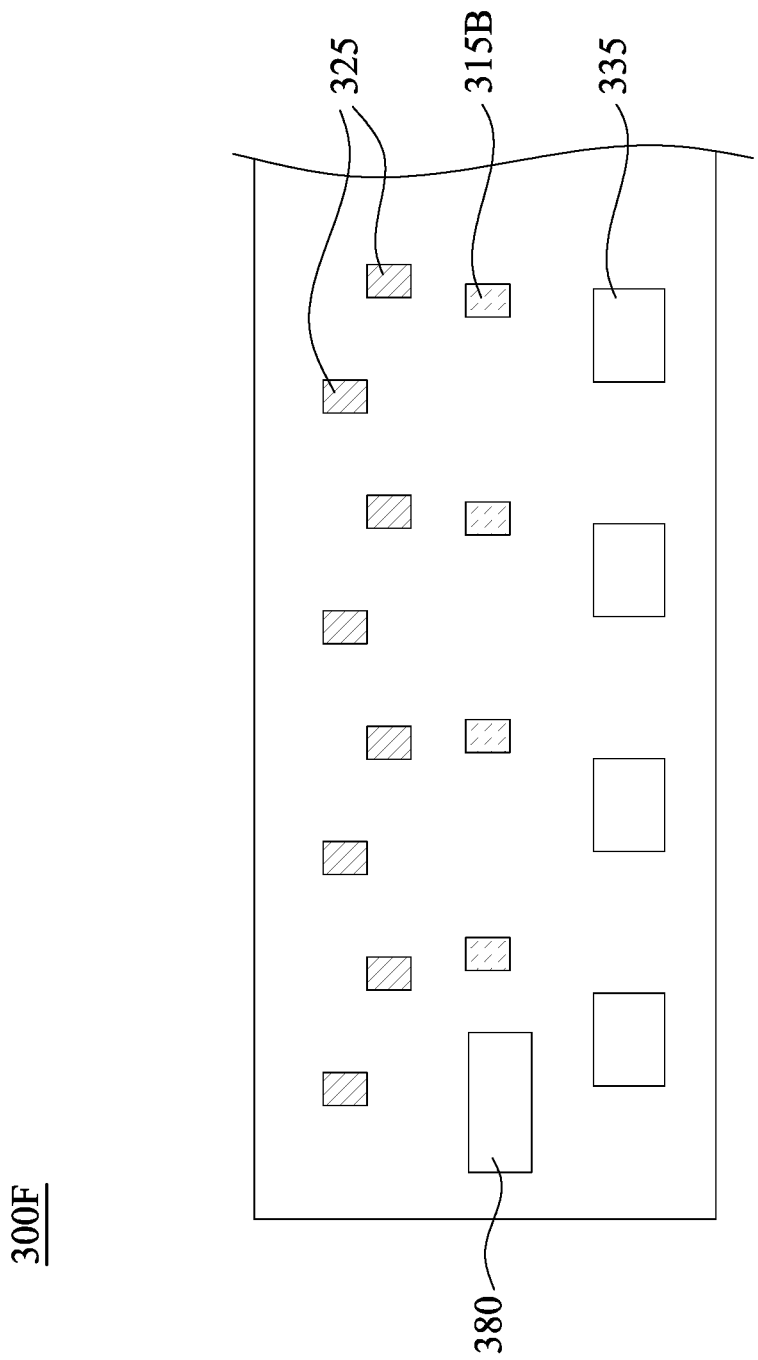
FIG. 19 is a schematic diagram of a source driver according to some embodiments of the present disclosure.

Reference is made to FIG. 19. FIG. 19 is a schematic diagram of the source driver 300F according to some embodiments of the present disclosure. The difference between the source driver 300F and the source driver 300B is that the source driver 300F further includes a common potential source 380. The common potential source 380 is electrically connected to the common potential pad 255 of the portion 210F (referring to FIG. 18).

In other words, in the display device 10F, the touch sensing leads 220 are electrically connected to one another through the common potential line 250. The common potential is provided by the common potential source 380 of the source driver 300F. The dummy terminals 315B of the source driver 300F are floating. In the display device 10F of some embodiments, the source driver 300F may not include the dummy terminals 315B.

It should be noted that since the source driver 300F does not have a touch sensing terminal (e.g., the touch sensing terminal 345 in FIG. 10), the display device 10F is for display purposes only.

Figure 20:
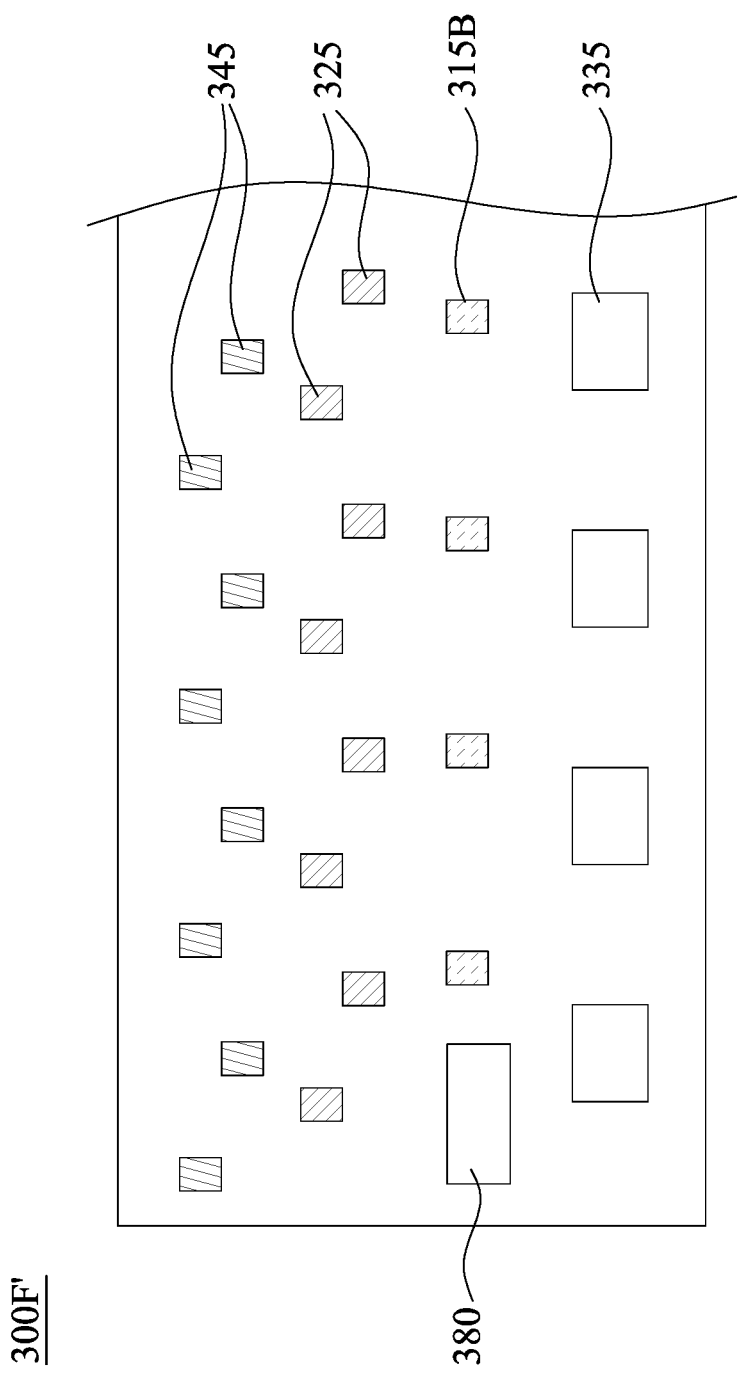
FIG. 20 is a schematic diagram of a source driver according to some embodiments of the present disclosure.

Reference is made to FIG. 20. FIG. 20 is a schematic diagram of the source driver 300F' according to some embodiments of the present disclosure. The difference between the source driver 300F' and the source driver 300F is that the source driver 300F' further includes a plurality of touch sensing terminals 345, which are electrically connected to the touch sensing pads 245 of the portion 210F (referring to FIG. 18). As such, when the portion 210F is cut along the dotted line L in FIG. 18 and the common potential line 250 is removed, the display device 10E is converted from a pure display device to a touch display device with the source driver 300F'. In some embodiments, the source driver 300F' may not include the dummy terminals 315B.

Figure 21:
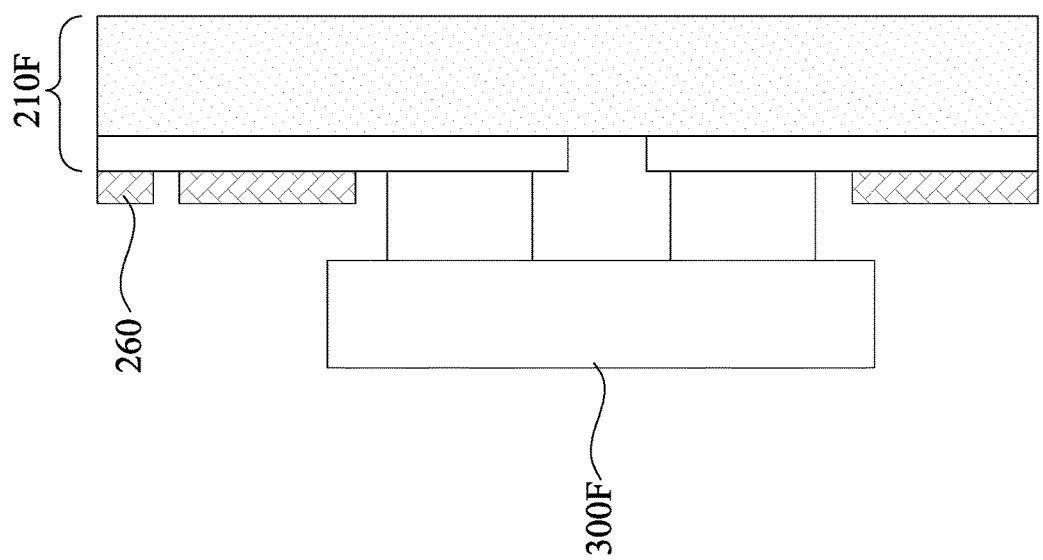
FIG. 21 is a partial cross-sectional view of a portion of a flexible printed circuit board and a source driver along a line 21 in FIG. 18 according to some embodiments of the present disclosure.

Reference is made to FIG. 21. FIG. 21 is a partial cross-sectional view of the portion 210F and the source driver 300F along a line 21 in FIG. 18 according to some embodiments of the present disclosure. Some components of the portion 210F are omitted from FIG. 21 for clarity. As shown in FIG. 21, in some embodiments, the flexible printed circuit board 200F further includes an insulating layer 260. The insulating layer 260 at least covers the common potential line 250 and the touch sensing leads 220 of the portion 210F. Similarly, in some embodiments, the flexible printed circuit board 200E may include an insulating layer 260.

According to the foregoing recitations of the embodiments of the disclosure, it may be seen that in the display devices of some embodiments of the present disclosure, by disposing dummy pads, the wiring between the flexible printed circuit boards and the source drivers can be more flexible. In addition, by combining different flexible printed circuit boards and source drivers and coupling them with the same in-cell touch display panels, both pure display device and touch display device may be achieved. To be more specific, in the display devices of some embodiments of the present disclosure, the flexible printed circuit boards may or may not include touch sensing pads. Also, the source drivers may or may not include touch sensing terminals. Therefore, by changing the wiring, dummy terminals or common potential terminals are disposed on the source drivers so that signals transmitted through the touch sensing pads and the touch sensing leads can be touch sensing signals or common potential signals. As such, in the fabrication of display devices, in-cell touch display panels can be fabricated on the main assembly line, while the number of pure display panels fabricated may be cut down gradually and thus reducing development costs.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. A display device, comprising:
an in-cell touch display panel comprising:
a plurality of touch sensing electrodes separated from one another;
a plurality of touch sensing pins electrically connected to the plurality of touch sensing electrodes;
a plurality of pixel electrodes; and
a plurality of source pins electrically connected to the plurality of pixel electrodes;
a flexible printed circuit board comprising:
a plurality of dummy pads;
a plurality of touch sensing leads electrically connected to the plurality of dummy pads and the plurality of touch sensing pins of the in-cell touch display panel;
a plurality of input pads;
a plurality of output pads; and
a plurality of output signal leads electrically connected to the plurality of output pads and the plurality of source pins of the in-cell touch display panel; and
a source driver comprising:
a plurality of input terminals electrically connected to the plurality of input pads of the flexible printed circuit board;
a plurality of output terminals electrically connected to the plurality of output pads of the flexible printed circuit board; and
a plurality of dummy terminals electrically connected to the plurality of dummy pads of the flexible printed circuit board, wherein the plurality of dummy terminals is floating or electrically connected to one another,
wherein the source driver does not comprise a touch sensing terminal.
2. The display device of claim 1, wherein the plurality of touch sensing electrodes forms an array.
3. The display device of claim 1, wherein the plurality of touch sensing pins of the in-cell touch display panel is electrically connected to one another.
4. The display device of claim 3, further comprising a common potential source, wherein the flexible printed circuit board further comprises a bypass line electrically connected to at least one of the plurality of touch sensing pins and the common potential source.
5. A display device, comprising:
an in-cell touch display panel comprising:
a plurality of touch sensing electrodes separated from one another;

a plurality of touch sensing pins electrically connected
to one another and electrically connected to the
plurality of touch sensing electrodes;
a plurality of pixel electrodes; and
a plurality of source pins electrically connected to the
plurality of pixel electrodes;
a flexible printed circuit board comprising:
a plurality of dummy pads;
a plurality of touch sensing leads electrically connected
to the plurality of dummy pads and the plurality of
touch sensing pins of the in-cell touch display panel;
a plurality of input pads;
a plurality of output pads; and
a plurality of output signal leads electrically connected
to the plurality of output pads and the plurality of
source pins of the in-cell touch display panel; and
a source driver comprising:
a plurality of input terminals electrically connected to
the plurality of input pads of the flexible printed
circuit board;
a plurality of output terminals electrically connected to
the plurality of output pads of the flexible printed
circuit board; and
a plurality of common potential terminals electrically
connected to the plurality of dummy pads of the
flexible printed circuit board,
wherein the source driver does not comprise a touch
sensing terminal.

6. A display device, comprising:
an in-cell touch display panel comprising:
a plurality of touch sensing electrodes separated from
one another;
a plurality of touch sensing pins electrically connected
to the plurality of touch sensing electrodes;
a plurality of pixel electrodes; and
a plurality of source pins electrically connected to the
plurality of pixel electrodes;
a flexible printed circuit board comprising:
a plurality of dummy pads;
a plurality of touch sensing leads electrically connected
to the plurality of dummy pads and the plurality of
touch sensing pins of the in-cell touch display panel;
a plurality of input pads;
a plurality of output pads; and
a plurality of output signal leads electrically connected
to the plurality of output pads and the plurality of
source pins of the in-cell touch display panel; and
a source driver comprising:
a plurality of input terminals electrically connected to
the plurality of input pads of the flexible printed
circuit board;
a plurality of output terminals electrically connected to
the plurality of output pads of the flexible printed
circuit board; and
a plurality of common potential terminals electrically
connected to the plurality of dummy pads of the
flexible printed circuit board, wherein the plurality of
common potential terminals is electrically connected
to one another,
wherein the source driver does not comprise a touch
sensing terminal.

7. A display device, comprising:
an in-cell touch display panel comprising:
a plurality of touch sensing electrodes separated from
one another;
a plurality of touch sensing pins electrically connected
to the plurality of touch sensing electrodes;
a plurality of pixel electrodes; and
a plurality of source pins electrically connected to the
plurality of pixel electrodes;
a flexible printed circuit board comprising:
a plurality of dummy pads;
a plurality of touch sensing leads electrically connected
to the plurality of touch sensing pins of the in-cell
touch display panel;
a plurality of touch sensing pads electrically connected
to the plurality of dummy pads and the plurality of
touch sensing leads;
a plurality of input pads;
a plurality of output pads; and
a plurality of output signal leads electrically connected
to the plurality of output pads and the plurality of
source pins of the in-cell touch display panel; and
a source driver comprising:
a plurality of input terminals electrically connected to
the plurality of input pads of the flexible printed
circuit board;
a plurality of output terminals electrically connected to
the plurality of output pads of the flexible printed
circuit board; and
a plurality of dummy terminals electrically connected
to the plurality of dummy pads of the flexible printed
circuit board, wherein the plurality of dummy terminals is floating or electrically connected to one
another,
wherein the source driver does not comprise a touch
sensing terminal.

8. The display device of claim 7, wherein the plurality of
touch sensing electrodes forms an array.

9. The display device of claim 7, wherein the plurality of
touch sensing pins of the in-cell touch display panel is
electrically connected to one another.

10. The display device of claim 9, further comprising a
common potential source, wherein the flexible printed circuit board further comprises a bypass line electrically connected to at least one of the plurality of touch sensing pins
and the common potential source.

11. The display device of claim 7, further comprising a
common potential source, wherein the flexible printed circuit board further comprises a bypass line electrically connected to at least one of the plurality of touch sensing pins
and the common potential source.

12. The display device of claim 7, wherein one of the
plurality of dummy pads is connected to some of the
plurality of touch sensing pads.

13. A display device, comprising:
an in-cell touch display panel comprising:
a plurality of touch sensing electrodes separated from
one another;
a plurality of touch sensing pins electrically connected
to one another and electrically connected to the
plurality of touch sensing electrodes;
a plurality of pixel electrodes; and
a plurality of source pins electrically connected to the
plurality of pixel electrodes;
a flexible printed circuit board comprising:
a plurality of dummy pads;
a plurality of touch sensing leads electrically connected
to the plurality of touch sensing pins of the in-cell
touch display panel;
a plurality of touch sensing pads electrically connected
to the plurality of dummy pads and the plurality of
touch sensing leads;
a plurality of input pads;

a plurality of output pads; and
a plurality of output signal leads electrically connected to the plurality of output pads and the plurality of source pins of the in-cell touch display panel; and
a source driver comprising:
a plurality of input terminals electrically connected to the plurality of input pads of the flexible printed circuit board;
a plurality of output terminals electrically connected to the plurality of output pads of the flexible printed circuit board; and
a plurality of common potential terminals electrically connected to the plurality of dummy pads of the flexible printed circuit board,
wherein the source driver does not comprise a touch sensing terminal.

14. A display device, comprising:
an in-cell touch display panel comprising:
a plurality of touch sensing electrodes separated from one another;
a plurality of touch sensing pins electrically connected to the plurality of touch sensing electrodes;
a plurality of pixel electrodes; and
a plurality of source pins electrically connected to the plurality of pixel electrodes;
a flexible printed circuit board comprising:
a plurality of dummy pads;
a plurality of touch sensing leads electrically connected to the plurality of touch sensing pins of the in-cell touch display panel;
a plurality of touch sensing pads electrically connected to the plurality of dummy pads and the plurality of touch sensing leads;
a plurality of input pads;
a plurality of output pads; and
a plurality of output signal leads electrically connected to the plurality of output pads and the plurality of source pins of the in-cell touch display panel; and
a source driver comprising:
a plurality of input terminals electrically connected to the plurality of input pads of the flexible printed circuit board;
a plurality of output terminals electrically connected to the plurality of output pads of the flexible printed circuit board; and
a plurality of common potential terminals electrically connected to the plurality of dummy pads of the flexible printed circuit board, wherein the plurality of common potential terminals are electrically connected to one another,
wherein the source driver does not comprise a touch sensing terminal.

15. A display device, comprising:
an in-cell touch display panel comprising:
a plurality of touch sensing electrodes separated from one another;
a plurality of touch sensing pins electrically connected to the plurality of touch sensing electrodes;
a plurality of pixel electrodes; and
a plurality of source pins electrically connected to the plurality of pixel electrodes;
a flexible printed circuit board comprising:
a plurality of touch sensing leads electrically connected to the plurality of touch sensing pins of the in-cell touch display panel;
a common potential line electrically connected to the plurality of touch sensing leads;
a plurality of input pads;
a plurality of output pads; and
a plurality of output signal leads electrically connected to the plurality of output pads and the plurality of source pins of the in-cell touch display panel;
a source driver comprising:
a plurality of input terminals electrically connected to the plurality of input pads of the flexible printed circuit board;
a plurality of output terminals electrically connected to the plurality of output pads of the flexible printed circuit board; and
a plurality of dummy terminals, wherein the plurality of dummy terminals is floating,
wherein the source driver does not comprise a touch sensing terminal; and
a common potential source electrically connected to the plurality of touch sensing leads and the common potential line.

16. The display device of claim 15, wherein the flexible printed circuit board further comprises an insulating layer covering the common potential line and the plurality of touch sensing leads.

17. The display device of claim 15, wherein the flexible printed circuit board further comprises a plurality of touch sensing pads.

18. A display device, comprising:
an in-cell touch display panel comprising:
a plurality of touch sensing electrodes separated from one another;
a plurality of touch sensing pins electrically connected to the plurality of touch sensing electrodes;
a plurality of pixel electrodes; and
a plurality of source pins electrically connected to the plurality of pixel electrodes;
a flexible printed circuit board comprising:
a plurality of touch sensing leads electrically connected to the plurality of touch sensing pins of the in-cell touch display panel;
a common potential line electrically connected to the plurality of touch sensing leads;
a common potential source electrically connected to the plurality of touch sensing leads;
a plurality of input pads;
a plurality of output pads; and
a plurality of output signal leads electrically connected to the plurality of output pads and the plurality of source pins of the in-cell touch display panel; and
a source driver comprising:
a plurality of input terminals electrically connected to the plurality of input pads of the flexible printed circuit board;
a plurality of output terminals electrically connected to the plurality of output pads of the flexible printed circuit board; and
a plurality of dummy terminals, wherein the plurality of dummy terminals is floating,
wherein the source driver does not comprise a touch sensing terminal.

19. The display device of claim 18, wherein the flexible printed circuit board further comprises an insulating layer covering the common potential line and the plurality of touch sensing leads.

20. The display device of claim 18, wherein the flexible printed circuit board further comprises a plurality of touch sensing pads.

* * * * *